(12) United States Patent
Lee et al.

(10) Patent No.: US 11,489,002 B2
(45) Date of Patent: Nov. 1, 2022

(54) LED DISPLAY APPARATUS

(71) Applicant: SEOUL VIOSYS CO., LTD., Ansan-si (KR)

(72) Inventors: Chung Hoon Lee, Ansan-si (KR); Dae Sung Cho, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 101 days.

(21) Appl. No.: 17/082,018

(22) Filed: Oct. 28, 2020

(65) Prior Publication Data

US 2021/0126043 A1 Apr. 29, 2021

Related U.S. Application Data

(60) Provisional application No. 62/927,196, filed on Oct. 29, 2019.

(51) Int. Cl.
 *H01L 27/15* (2006.01)
 *H01L 25/075* (2006.01)
 (Continued)

(52) U.S. Cl.
 CPC .......... *H01L 27/15* (2013.01); *H01L 25/0753* (2013.01); *H01L 33/0095* (2013.01); *H01L 33/387* (2013.01); *H01L 33/44* (2013.01); *H01L 33/58* (2013.01); *H01L 33/62* (2013.01); *H01L 2933/0016* (2013.01);
 (Continued)

(58) Field of Classification Search
 CPC . H01L 27/15; H01L 25/0753; H01L 33/0095; H01L 33/387; H01L 33/44; H01L 33/58; H01L 33/62; H01L 2933/0016; H01L 2933/0025; H01L 2933/0058; H01L 2933/0066; H01L 27/153; H01L 25/0756
 See application file for complete search history.

(56) References Cited

U.S. PATENT DOCUMENTS

2014/0312368 A1* 10/2014 Lee .................. H01L 33/502
 257/89
2016/0087165 A1* 3/2016 Lee .................. H01L 33/502
 438/27

(Continued)

FOREIGN PATENT DOCUMENTS

KR 10-1100579 1/2012
KR 10-2017-0133765 12/2017

(Continued)

OTHER PUBLICATIONS

International Search Report dated Feb. 10, 2021, issued to PCT/KR2020/014851 (With English Translation).

*Primary Examiner* — Victor A Mandala
(74) *Attorney, Agent, or Firm* — H.C. Park & Associates, PLC

(57) ABSTRACT

A display apparatus including a display substrate, a plurality of light emitting devices disposed on the display substrate, a light blocking layer disposed between the light emitting devices, and a transparent layer covering the light emitting devices and the light blocking layer, in which the light emitting device includes a first LED sub-unit, a second LED sub-unit disposed on the first LED sub-unit, and a third LED sub-unit disposed on the second LED sub-unit, and the third LED sub-unit is disposed closer to an upper surface of the light emitting device than the first LED sub-unit.

20 Claims, 38 Drawing Sheets

(51) Int. Cl.
*H01L 33/00* (2010.01)
*H01L 33/38* (2010.01)
*H01L 33/44* (2010.01)
*H01L 33/62* (2010.01)
*H01L 33/58* (2010.01)

(52) U.S. Cl.
CPC ........... *H01L 2933/0025* (2013.01); *H01L 2933/0058* (2013.01); *H01L 2933/0066* (2013.01)

(56) References Cited

U.S. PATENT DOCUMENTS

| | | | | |
|---|---|---|---|---|
| 2019/0164944 | A1* | 5/2019 | Chae | H01L 25/13 |
| 2019/0165207 | A1* | 5/2019 | Kim | H01L 33/385 |
| 2019/0214373 | A1* | 7/2019 | Kim | H01L 33/62 |
| 2019/0229097 | A1* | 7/2019 | Takeya | H01L 21/6835 |
| 2020/0144233 | A1* | 5/2020 | Lee | H01L 24/16 |
| 2020/0144465 | A1* | 5/2020 | Lee | H01L 27/156 |
| 2020/0152692 | A1* | 5/2020 | Liao | H01L 27/156 |
| 2020/0184884 | A1* | 6/2020 | Lau | H05B 45/10 |
| 2020/0212262 | A1* | 7/2020 | Jang | H01L 33/62 |
| 2020/0219858 | A1* | 7/2020 | Chang | H01L 25/0756 |
| 2020/0295228 | A1* | 9/2020 | Jang | H01L 33/24 |
| 2020/0357846 | A1* | 11/2020 | Lee | H01L 25/0655 |
| 2020/0365568 | A1* | 11/2020 | Jang | H01L 33/0093 |
| 2020/0365647 | A1* | 11/2020 | Jang | H01L 33/44 |
| 2020/0365648 | A1* | 11/2020 | Jang | H01L 33/0093 |
| 2020/0365649 | A1* | 11/2020 | Jang | H01L 33/38 |
| 2021/0057481 | A1* | 2/2021 | Chae | H01L 33/22 |
| 2021/0082887 | A1* | 3/2021 | Jang | H01L 27/153 |
| 2021/0098526 | A1* | 4/2021 | Cho | H01L 25/0753 |
| 2021/0110762 | A1* | 4/2021 | Pan | H01L 27/3262 |
| 2021/0111162 | A1* | 4/2021 | Takeya | H01L 25/0753 |
| 2021/0125972 | A1* | 4/2021 | Jang | H01L 25/0753 |
| 2021/0126046 | A1* | 4/2021 | Jang | H01L 33/56 |
| 2021/0126174 | A1* | 4/2021 | Jang | H01L 33/62 |

FOREIGN PATENT DOCUMENTS

| | | |
|---|---|---|
| KR | 10-2019-0003162 | 1/2019 |
| KR | 10-2019-0030484 | 3/2019 |

* cited by examiner

LED DISPLAY APPARATUS

CROSS-REFERENCE TO RELATED APPLICATION

This application claims priority from and the benefit of U.S. Provisional Patent Application No. 62/927,196, filed on Oct. 29, 2019, which is hereby incorporated by reference for all purposes as if fully set forth herein.

BACKGROUND

Field

Exemplary embodiments of the invention relate generally to a display apparatus, and, more particularly, to an LED display apparatus.

Discussion of the Background

As an inorganic light source, light emitting diodes have been used in various technical fields, such as displays, vehicular lamps, general lighting, and the like. With various advantages of light emitting diodes over conventional light sources, such as longer lifespan, lower power consumption, and rapid response, light emitting diodes have been replacing conventional light sources.

Light emitting diodes have been used as backlight light sources in display apparatuses. However, LED displays that directly display images using the light emitting diodes have been recently developed.

In general, a display apparatus realizes various colors through mixture of blue, green, and red light. In order to display various images, the display apparatus includes a plurality of pixels, each having sub-pixels corresponding to blue, green, and red light, respectively. In this manner, a color of a certain pixel is determined based on the colors of the sub-pixels so that images can be displayed through combination of such pixels.

Since LEDs can emit various colors depending upon materials thereof, a display apparatus may be formed by arranging individual LED chips emitting blue, green, and red light on a two-dimensional plane. However, when one LED chip is arranged in each sub-pixel, the number of LED chips may be increased, which may require excessive time for a mounting process during manufacture.

Since the sub-pixels are arranged on the two-dimensional plane in the display apparatus, a relatively large area is occupied by one pixel that includes the sub-pixels for blue, green, and red light. As such, an area of each LED chip may need to be reduced to arrange the sub-pixels in a restricted area. However, reduction in size of LED chips may cause difficulty in mounting the LED chips, as well as reducing luminous areas of the LED chips.

Meanwhile, a display apparatus that realizes various colors needs to consistently provide high-quality white light. Conventional TVs use an RGB mixing ratio of 3:6:1 to realize the standard white light of D65. More particularly, luminous intensity of red is higher than that of blue, and luminous intensity of green is relatively the highest. However, since conventional LED chips have relatively very high luminous intensity of blue LED compared to that of other LEDs, it is difficult to match the RGB mixing ratio in the display apparatus using LED chips.

In addition, when viewing angles of blue, green, and red light emitted from one pixel are large, interference of light between adjacent pixels may occur, which makes it difficult to realize a clear image quality. However, when a viewing angle of light emitted from one pixel is narrow, light variation is likely to occur due to a difference in luminous intensities between pixels. As such, the viewing angle of light emitted from the pixel may need to be adjusted to an appropriate level.

The above information disclosed in this Background section is only for understanding of the background of the inventive concepts, and, therefore, it may contain information that does not constitute prior art.

SUMMARY

Display apparatuses constructed according to exemplary embodiments of the invention are capable of increasing an area of each sub-pixel in a restricted pixel area.

Exemplary embodiments also provide a display apparatus that is capable of reducing a time associated with a mounting process.

Exemplary embodiments further provide a display apparatus that is capable of easily controlling an RGB mixing ratio.

Exemplary embodiments still provide a display apparatus in which viewing angles of various colors of light emitted within one pixel are adjusted to an appropriate level.

Additional features of the inventive concepts will be set forth in the description which follows, and in part will be apparent from the description, or may be learned by practice of the inventive concepts.

A display apparatus according to an exemplary embodiment includes a display substrate, a plurality of light emitting devices disposed on the display substrate, a light blocking layer disposed between the light emitting devices, and a transparent layer covering the light emitting devices and the light blocking layer, in which at least one of the light emitting devices includes a first LED sub-unit, a second LED sub-unit disposed on the first LED sub-unit, and a third LED sub-unit disposed on the second LED sub-unit, and the third LED sub-unit is disposed closer to an upper surface of the light emitting device than the first LED sub-unit.

The light blocking layer may be configured to block light by absorbing light emitted from the light emitting device, and the transparent layer may be configured to transmit light emitted from the light emitting device.

The light blocking layer may include a black molding layer.

The first, second, and third LED sub-units may be configured to emit red light, blue light, and green light, respectively.

The first LED sub-unit may include a first light emitting stack, the second LED sub-unit may include a second light emitting stack, the third LED sub-unit may include a third light emitting stack, and each of the light emitting stacks may include a first conductivity type semiconductor layer, an active layer, and a second conductivity type semiconductor layer.

The transparent layer may partially cover the light emitting devices.

The transparent layer may be disposed to cross the light emitting devices in one direction.

The transparent layer may have a mesh shape and may include a first transparent layer extending in a lateral direction and a second transparent layer extending in a longitudinal direction, the first transparent layer may cross the light emitting devices, and the second transparent layer may be disposed on the light blocking layer in a region between the light emitting devices.

An upper surface of the light blocking layer may be placed at the same elevation or lower than that of the light emitting device.

The light emitting device may further include a substrate disposed on the third LED sub-unit, and a difference in refractive indices between the transparent layer and air may be less than a difference in refractive indices between the substrate and the first conductivity type semiconductor of the third light emitting stack.

The light emitting device may further include a substrate disposed on the third LED sub-unit, and the upper surface of the light blocking layer may be placed at a lower elevation than that of an upper surface of the substrate to expose at least a portion of a side surface of the substrate.

The light blocking layer may be placed a lower elevation than that of an upper surface of the third light emitting stack to expose at least a portion of a side surface of the third light emitting stack.

The light emitting device may further include a first bonding layer interposed between the first LED sub-unit and the second LED sub-unit, and a second bonding layer interposed between the second LED sub-unit and the third LED sub-unit.

The light emitting device may further include a first connection electrode electrically connected to the first LED sub-unit, a second connection electrode electrically connected to the second LED sub-unit, a third connection electrode electrically connected to the third LED sub-unit, and a fourth connection electrode commonly electrically connected to the first, second, and third sub-units.

The display apparatus may further include a circuit board interposed between the display substrate and the light emitting device, in which the first, second, third, and fourth connection electrodes may be bonded to the circuit board, and the light blocking layer may be disposed on the circuit board.

The first connection electrode, the second connection electrode, and the third connection electrode may be electrically connected to the second conductivity type semiconductor layers of the first light emitting stack, the second light emitting stack, and the third light emitting stack, respectively, and the fourth connection electrode may be commonly electrically connected to the first conductivity type semiconductor layers of the first, second, and third light emitting stacks.

The light emitting device may further include first, second, and third lower contact electrodes contacting the second conductivity type semiconductor layers of the first, second, and third light emitting stacks, respectively, and a first insulation layer having first, second, and third contact holes partially exposing the first, second, and third lower contact electrodes, the first insulation layer may have sub-contact holes disposed on the first conductivity type semiconductor layers of the first, second, and third light emitting stacks, and the sub-contact holes may be spaced apart from one another.

The light emitting device may further include first, second, and third pads overlapping with the first, second, and third contact holes and a fourth pad overlapping with the sub-contact holes, and the first, second, third, and fourth connection electrodes may be electrically connected to the first, second, third, and fourth pads, respectively.

A display apparatus according to another exemplary embodiment includes a display substrate, a plurality of light emitting devices disposed on the display substrate, a black molding layer disposed between the light emitting devices to block light emitted from the light emitting devices, and a transparent layer at least partially covering the light emitting devices and configured to transmit light emitted from the light emitting devices, in which at least one of the light emitting devices includes a first LED sub-unit, a second LED sub-unit disposed on the first LED sub-unit, and a third LED sub-unit disposed on the second LED sub-unit, and the third LED sub-unit is disposed closer to an upper surface of the light emitting device than the first LED sub-unit.

An upper surface of the black molding layer may be placed at the same elevation or lower than those of the light emitting devices.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
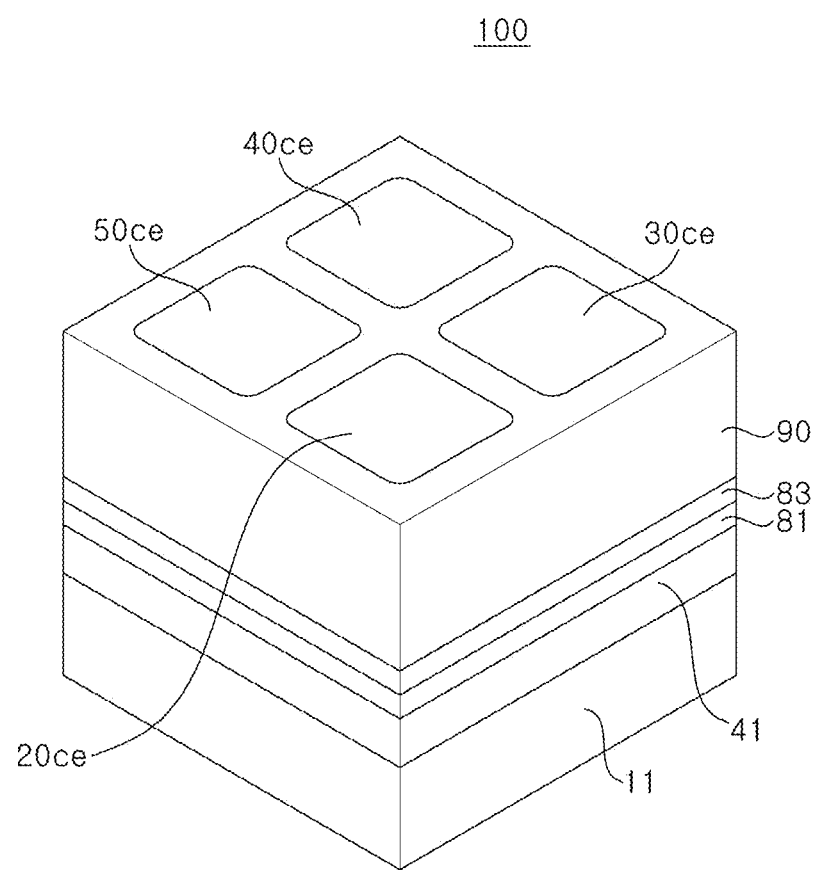
FIG. 1A is a schematic perspective view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described in detail with reference to the accompanying drawings. As used herein a light emitting stack structure, a light emitting device, or a light emitting package may include micro-LEDs, which have a light emitting area of 10,000 $\mu m^2$ or less as well known in the art. In other exemplary embodiments, the micro-LED may have a light emitting area of 4,000 $\mu m^2$ or less, and further, 2,500 $\mu m^2$ or less.

Figure 1B:
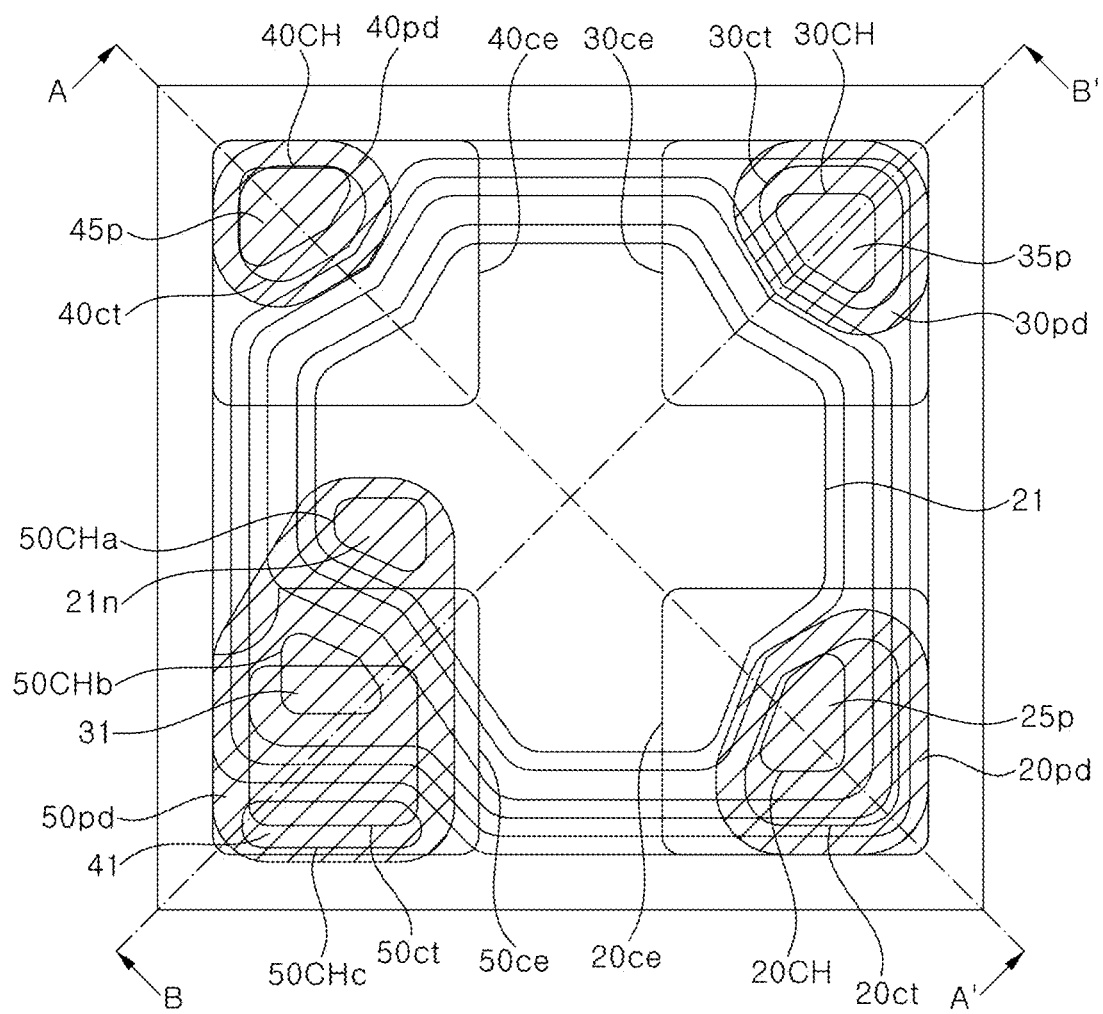
FIG. 1B is a schematic plan view of the light emitting device of FIG. 1A.
Figure 1C:
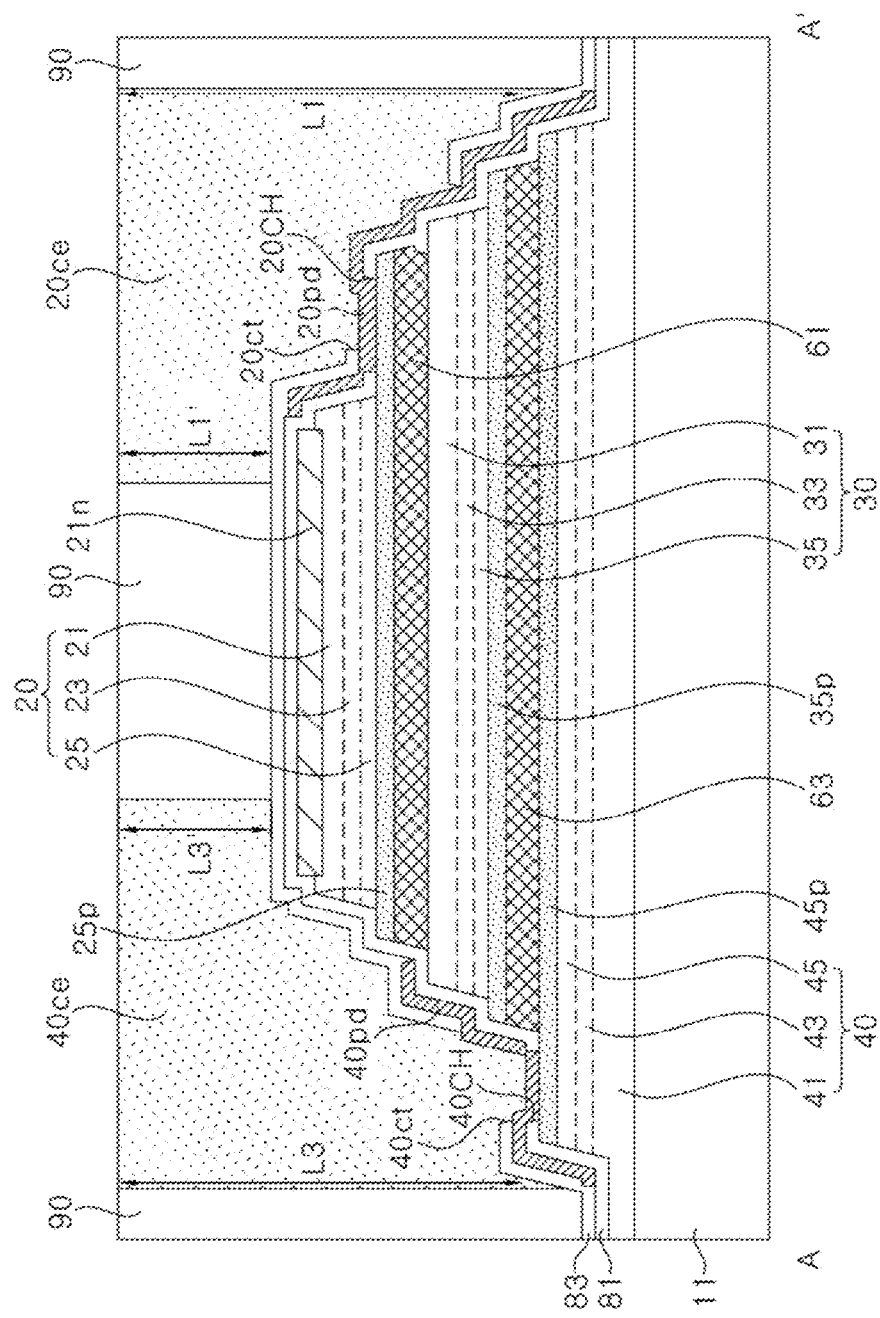
FIG. 1C and FIG. 1D are schematic cross-sectional views taken along lines A-A' and B-B' of FIG. 1B, respectively.
Figure 1D:
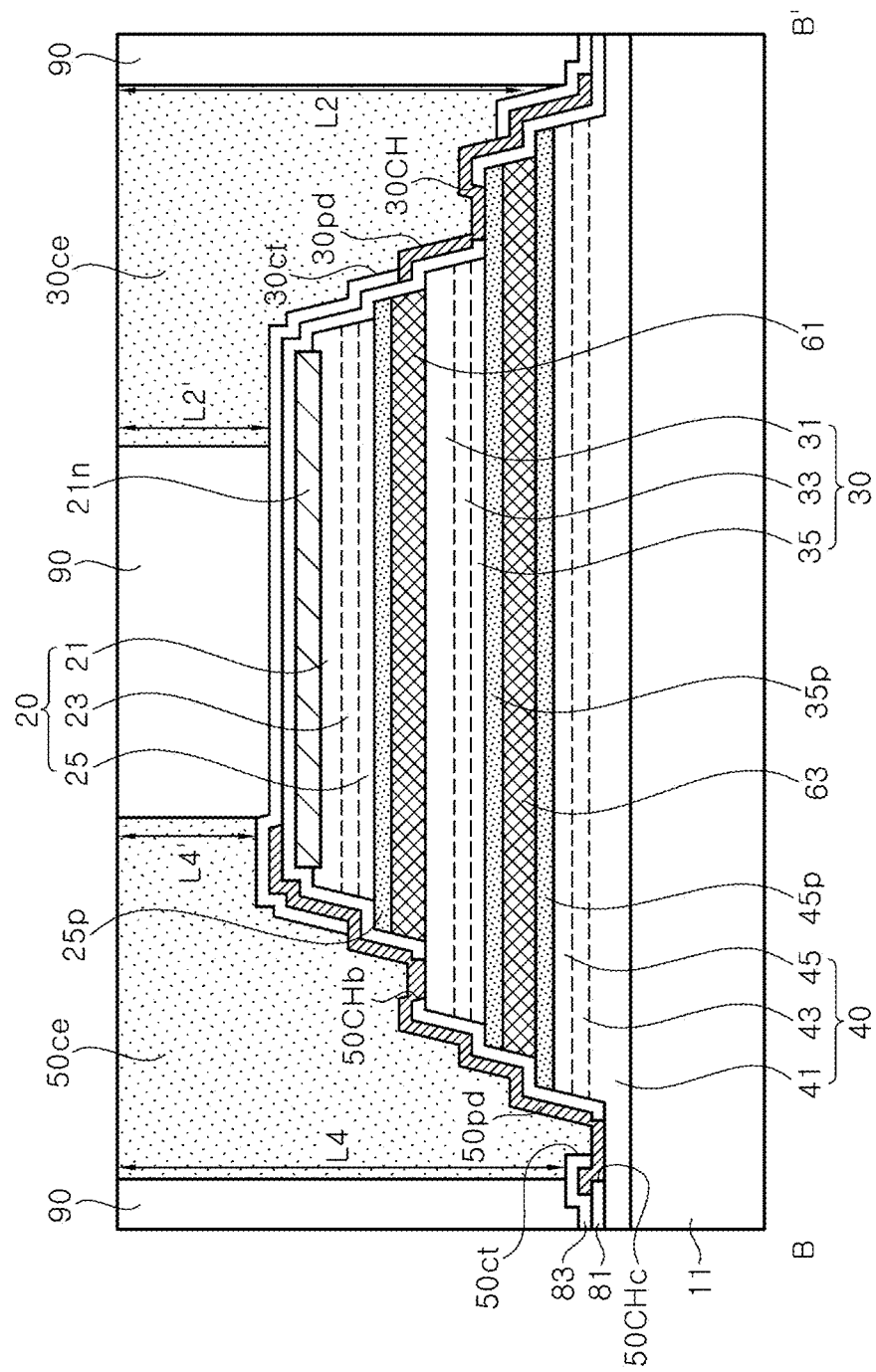

FIG. 1A is a schematic perspective view of a light emitting device according to an exemplary embodiment. FIG. 1B is a schematic plan view of the light emitting device of FIG. 1A, and FIG. 1C and FIG. 1D are schematic cross-sectional views taken along lines A-A' and B-B' of FIG. 1B, respectively.

Referring to FIGS. 1A and 1B, a light emitting device 100 includes a light emitting stack structure, a first connection electrode 20ce, a second connection electrode 30ce, a third connection electrode 40ce, and a fourth connection electrode 50ce formed on the light emitting stack structure, and a protection layer 90 surrounding the connection electrodes 20ce, 30ce, 40ce, and 50ce. An array of light emitting devices 100 may be formed on a substrate 11, and the light emitting device 100 illustrated in FIG. 1A shows the one singularized from the array, and thus may be referred to as a light emitting device. The configuration and singularization of the light emitting devices 100 will be described in more detail later. In some exemplary embodiments, the light emitting device 100 including the light emitting stack structure may be further processed to be formed into a light emitting package, which will be also described in more detail later.

Referring to FIGS. 1A through 1D, the light emitting device 100 according to the illustrated exemplary embodiment may include a light emitting stack structure, and include a first LED sub-unit, a second LED sub-unit, and a third LED sub-unit disposed on a substrate. The first LED sub-unit may include a first light emitting stack 20, the second LED sub-unit may include a second light emitting stack 30, and the third LED sub-unit may include a third light emitting stack 40. The light emitting stack structure is exemplarily shown as including three light emitting stacks 20, 30, and 40, but the inventive concepts are not limited to a specific number of light emitting stacks. For example, in some exemplary embodiments, the light emitting stack structure may include two or more of light emitting stacks. Hereinafter, the light emitting stack structure will exemplarily be described as including three light emitting stacks 20, 30, and 40.

The substrate 11 may include a light-transmitting insulating material to transmit light. However, in some exemplary embodiments, the substrate 11 may be formed to be translucent or partially transparent to transmit only light of a specific wavelength or only a portion of light of a specific wavelength. The substrate 11 may be a growth substrate to epitaxially grow the third light emitting stack 40 thereon, for example, a sapphire substrate. However, the substrate 11 is not limited to the sapphire substrate, and may include other various transparent insulating materials. For example, the substrate 11 may include glass, quartz, silicon, an organic polymer, or an organic-inorganic composite material, such as silicon carbide (SiC), gallium nitride (GaN), indium gallium nitride (InGaN), aluminum gallium nitride (AlGaN), aluminum nitride (AlN), gallium oxide ($Ga_2O_3$), or a silicon substrate. In addition, the substrate 11 may include irregularities on an upper surface thereof, and for example, may be a patterned sapphire substrate. The irregularities formed on the upper surface of the substrate 11 may increase extraction efficiency of light generated in the third light emitting stack 40 which is in contact with the substrate 11. The irregularities of the substrate 11 may be included to selectively increase luminous intensity of the third light emitting stack 40 compared to those of the first light emitting stack 20 and the second light emitting stack 30. In another exemplary embodiment, the substrate 11 may be removed.

The first, second, and third light emitting stacks 20, 30, and 40 are configured to emit light toward the substrate 11. Accordingly, light emitted from the first light emitting stack 20 may pass through the second and third light emitting stacks 30 and 40. According to an exemplary embodiment, the first, second, and third light emitting stacks 20, 30, and 40 may emit light having different peak wavelengths from one another. In an exemplary embodiment, a light emitting stack disposed further from the substrate 11 emits light having a longer wavelength than that of light emitted from a light emitting stack disposed closer to the substrate 11, such that loss of light may be reduced. For example, the first light emitting stack 20 may emit red light, the second light emitting stack 30 may emit green light, and the third light emitting stack 40 may emit blue light.

In another exemplary embodiment, to adjust a color mixing ratio of the first, second, and third light emitting stacks 20, 30, and 40, the second light emitting stack 30 may emit light of a shorter wavelength than that of the third light emitting stack 40. Accordingly, luminous intensity of the second light emitting stack 30 may be reduced, and luminous intensity of the third light emitting stack 40 may be increased, and thus, luminous intensity ratios of light emitted from the first, second, and third light emitting stacks may be significantly changed. For example, the first light emitting stack 20 may be configured to emit red light, the second emission stack 30 may be configured to emit blue light, and the third emission stack 40 may be configured to emit green light. In this manner, luminous intensity of blue light may be relatively reduced, and luminous intensity of green light may be relatively increased, and thus, luminous intensity ratios of red, green, and blue light may be easily adjusted to approach 3:6:1. Moreover, light emitting areas of the first, second, and third light emitting light emitting stacks 20, 30, and 40 may be about 10,000 $\mu m^2$ or less, 4,000 $\mu m^2$ or less, or 2,500 $\mu m^2$ or less depending on an application. In addition, as the light emitting stack is disposed closer to the substrate 11, the emitting area may become larger. As such, since the third light emitting stack 40 that emits green light is disposed the closest to the substrate 11, luminous intensity of green light may be further increased.

Hereinafter, while the second light emitting stack 30 is exemplarily described as emitting light of a shorter wavelength than that emitted from the third light emitting stack 40, it should be noted that the second light emitting stack 30 emits light of a longer wavelength than that emitted from the third light emitting stack 40, such as green light.

The first light emitting stack 20 includes a first conductivity type semiconductor layer 21, an active layer 23, and a second conductivity type semiconductor layer 25. According to an exemplary embodiment, the first light emitting stack 20 may include a semiconductor material, such as AlGaAs, GaAsP, AlGaInP, and GaP that emits red light, but the inventive concepts are not limited thereto.

A first upper contact electrode 21n may be disposed on the first conductivity type semiconductor layer 21 to be in ohmic contact with the first conductivity type semiconductor layer 21. A first lower contact electrode 25p may be disposed under the second conductivity type semiconductor layer 25. According to an exemplary embodiment, a portion of the first conductivity type semiconductor layer 21 may be patterned and recessed, and the first upper contact electrode 21n may be disposed in the recessed region of the first conductivity type semiconductor layer 21 to increase an ohmic contact level. The first upper contact electrode 21n may have a single-layer structure or a multiple-layer structure, and may include Al, Ti, Cr, Ni, Au, Ag, Sn, W, Cu, or an alloy thereof, such as Au—Te alloy or Au—Ge alloy, but the inventive concepts are not limited thereto. In an exemplary embodiment, the first upper contact electrode 21n may have a thickness of about 100 nm, and may include metal having high reflectivity to increase light emission efficiency in a downward direction toward the substrate 11.

The second light emitting stack 30 includes a first conductivity type semiconductor layer 31, an active layer 33, and a second conductivity type semiconductor layer 35. According to an exemplary embodiment, the second light emitting stack 30 may include a semiconductor material, such as GaN, InGaN, ZnSe that emits blue light, but the inventive concepts are not limited thereto. A second lower contact electrode 35p is disposed under the second conductivity type semiconductor layer 35 of the second light emitting stack 30.

The third light emitting stack 40 includes a first conductivity type semiconductor layer 41, an active layer 43, and a second conductivity type semiconductor layer 45. According to an exemplary embodiment, the third light emitting stack 40 may include a semiconductor material, such as GaN, InGaN, GaP, AlGaInP, AlGaP, or the like that emits green light. A third lower contact electrode 45p is disposed on the second conductivity type semiconductor layer 45 of the third light emitting stack 40.

According to an exemplary embodiment, each of the first conductivity type semiconductor layers 21, 31, and 41 and the second conductivity type semiconductor layers 25, 35, and 45 of the first, second, and third light emitting stacks 20, 30, and 40 may have a single-layer structure or a multiple-layer structure, and in some exemplary embodiments, may include a superlattice layer. Moreover, the active layers 23, 33, and 43 of the first, second, and third light emitting stacks 20, 30, and 40 may have a single-quantum well structure or a multiple-quantum well structure.

Each of the first, second, and third lower contact electrodes 25p, 35p, and 45p may include a transparent conductive material that transmits light. For example, the lower contact electrodes 25p, 35p, and 45p may include transparent conductive oxide (TCO), such as SnO, $InO_2$, ZnO, ITO, ITZO, or the like, without being limited thereto.

A first adhesive layer 61 is disposed between the first light emitting stack 20 and the second light emitting stack 30, and a second adhesive layer 63 is disposed between the second light emitting stack 30 and the third light emitting stack 40. The first and second adhesive layers 61 and 63 may include a non-conductive material that transmits light. For example, the first and second adhesive layers 61 and 63 may include an optically clear adhesive (OCA), which may include epoxy, polyimide, SUB, spin-on-glass (SOG), benzocyclobutene (BCB), but the inventive concepts are not limited thereto.

According to the illustrated exemplary embodiment, a first insulation layer 81 and a second insulation layer 83 are disposed on at least portions of side surfaces of the first, second, and third light emitting stacks 20, 30, and 40. At least one of the first and second insulation layers 81 and 83 may include various organic or inorganic insulating materials, such as polyimide, $SiO_2$, $SiN_x$, $Al_2O_3$, or the like. For example, at least one of the first and second insulation layers 81 and 83 may include a distributed Bragg reflector (DBR). As another example, at least one of the first and second insulation layers 81 and 83 may include a black organic polymer. In some exemplary embodiments, an electrically floating metal reflection layer is disposed on the first and second insulation layers 81 and 83 and may reflect light emitted from the light emitting stacks 20, 30, and 40 toward the substrate 11. In some exemplary embodiments, at least one of the first and second insulation layers 81 and 83 may have a single-layer structure or a multiple-layer structure formed of two or more insulation layers having different refractive indices.

According to an exemplary embodiment, each of the first, second, and third light emitting stacks 20, 30, and 40 may be driven independently. More specifically, a common voltage may be applied to one of the first and second conductivity type semiconductor layers of each of the light emitting stacks, and an individual emission signal may be applied to the remaining one of the first and second conductivity type semiconductor layers of each of the light emitting stacks. For example, according to an exemplary embodiment, the first conductivity type semiconductor layers 21, 31, and 41 of each of the light emitting stacks 20, 30, and 40 may be n-type, and the second conductivity type semiconductor layers 25, 35, and 45 of each of the light emitting stacks 20, 30, and 40 may be p-type. In this case, the third light emitting stack 40 may have a stacked sequence that is opposite to those of the first light emitting stack 20 and the second light emitting stack 30, and thus, the p-type semiconductor layer 45 may be disposed on the active layer 43 to simplify the processes of manufacturing the light emitting device 100. Hereinafter, the first conductivity type and the second conductivity type semiconductor layers may exemplarily be described as n-type and p-type, respectively. In some exemplary embodiments, however, n-type and p-type may be reversed.

Each of the first, second, and third lower contact electrodes 25p, 35p, and 45p that are connected to the p-type semiconductor layers 25, 35, and 45 of the light emitting stacks, respectively, may be electrically connected to the first, second, and third connection electrodes 20ce, 30ce, and 40ce to receive corresponding light emission signals, respectively. Meanwhile, the n-type semiconductor layers 21, 31, and 41 of the light emitting stacks may be commonly electrically connected to the fourth connection electrode 50ce. As such, the light emitting device 100 may have a common n-type light emitting stack structure, in which the n-type semiconductor layers 21, 31, and 41 of the first, second, and third light emitting stacks 20, 30, and 40 are commonly connected, and may be driven independently from one another. Since the light emitting device 100 has the common n-type light emitting structure, sources of voltages applied to the first, second, and third light emitting stacks 20, 30, and 40 may be set to be different from one another.

The light emitting device 100 according to the illustrated exemplary embodiment has the common n-type structure, but the inventive concepts are not limited thereto. For example, in some exemplary embodiments, the first conductivity type semiconductor layers 21, 31, and 41 of each of the light emitting stacks may be p-type, and the second conductivity type semiconductor layer 25, 35, and 45 of each of the light emitting stacks may be n-type, and thus, a common p-type light emitting stack structure may be formed. In addition, in some exemplary embodiments, the stacked sequence of each of the light emitting stacks is not limited to that shown in the drawing, but may be variously modified.

Hereinafter, the light emitting device 100 will exemplarily be described as having the common n-type light emitting stack structure.

According to the illustrated exemplary embodiment, the light emitting device 100 includes a first pad 20pd, a second pad 30pd, a third pad 40pd, and a fourth pad 50pd. The first pad 20pd is electrically connected to the first lower contact electrode 25p through a first contact hole 20CH defined through the first insulation layer 81. The first connection electrode 20ce is electrically connected to the first pad 20pd through a first through hole 20ct defined through the second insulation layer 83. The second pad 30pd is electrically connected to the second lower contact electrode 35p through a second contact hole 30CH defined through the first insulation layer 81. The second connection electrode 30ce is electrically connected to the second pad 30pd through a second through hole 30ct defined through the second insulation layer 83.

The third pad 40pd is electrically connected to the third lower contact electrode 45p through a third contact hole 40CH defined through the first insulation layer 81. The third connection electrode 40ce is electrically connected to the third pad 40pd through a third through hole 40ct defined through the second insulation layer 83. The fourth pad 50pd is electrically connected to the first conductivity type semiconductor layers 21, 31, and 41 of the first, second, and third light emitting stacks 20, 30, and 40 through a first sub-contact hole 50CHa, a second sub-contact hole 50CHb, and a third sub-contact hole 50CHc defined on the first conductivity type semiconductor layers 21, 31, and 41 of the first, second, and third light emitting stacks 20, 30, and 40. In particular, the first sub-contact hole 50CHa may expose the first upper contact electrode 21n, and the fourth pad 50pd may be connected to the first upper contact electrode 21n through the first sub-contact hole 50CHa. In this manner, the fourth pad 50pd may be electrically connected to the first conductivity type semiconductor layers 21, 31, and 41 through the sub-contact holes 50CHa, 50CHb, 50CHc, so that processes of manufacturing the light emitting device 100 may be simplified. The fourth connection electrode 50ce is electrically connected to the fourth pad 50pd through a fourth through hole 50ct defined through the second insulation layer 83.

In the illustrated exemplary embodiment, although each of the connection electrodes 20ce, 30ce, 40ce, and 50ce are shown and described as directly contacting the pads 20pd, 30pd, 40pd, and 50pd, in some exemplary embodiments, the connection electrodes 20ce, 30ce, 40ce, and 50ce may not be directly connected to the pads 20pd, 30pd, 40pd, and 50pd, and other connectors may be interposed therebetween.

The first, second, third, and fourth pads 20pd, 30pd, 40pd, and 50pd are spaced apart and insulated from one another. According to an exemplary embodiment, each of the first, second, third, and fourth pads 20pd, 30pd, 40pd, and 50pd may cover at least portions of side surfaces of the first, second, and third light emitting stacks 20, 30, and 40. In this manner, heat generated from the first, second, and third light emitting stacks 20, 30, and 40 may be easily dissipated.

According to the illustrated exemplary embodiment, each of the connection electrodes 20ce, 30ce, 40ce, and 50ce may have a substantially elongated shape that protrudes upward from the substrate 11. The connection electrodes 20ce, 30ce, 40ce, and 50ce may include metal, such as Cu, Ni, Ti, Sb, Zn, Mo, Co, Sn, Ag, or an alloy thereof, but the inventive concepts are not limited thereto. For example, each of the connection electrodes 20ce, 30ce, 40ce, and 50ce may include two or more metals or a plurality of different metal layers to reduce stress from the elongated shape of the connection electrodes 20ce, 30ce, 40ce, and 50ce. In another exemplary embodiment, when the connection electrodes 20ce, 30ce, 40ce, and 50ce include Cu, an additional metal may be deposited or plated to inhibit oxidation of Cu. In some exemplary embodiments, when the connection electrodes 20ce, 30ce, 40ce, and 50ce include Cu/Ni/Sn, Cu may prevent Sn from permeating into the light emitting stack structure. In some exemplary embodiments, the connection electrodes 20ce, 30ce, 40ce, and 50ce may include a seed layer for forming a metal layer in a plating process, which will be described in more detail later.

As shown in the drawings, each of the connection electrodes 20ce, 30ce, 40ce, and 50ce may have a substantially flat upper surface, thereby facilitating electrical connection between external lines or electrodes and the light emitting stack structure. According to an exemplary embodiment, when the light emitting device 100 includes micro LEDs having a surface area of about 10,000 $\mu m^2$ or less, about 4,000 $\mu m^2$ or less, or about 2,500 $\mu m^2$ or less as well known in the art, the connection electrodes 20ce, 30ce, 40ce, and 50ce may be overlapped with at least a portion of one of the first, second, and third light emitting stacks 20, 30, and 40 as shown in the drawing. More specifically, the connection electrodes 20ce, 30ce, 40ce, and 50ce may be overlapped with at least one step that is formed on the side surface of the light emitting stack structure. As such, since a lower surface of the connection electrode provides a larger contact area than an upper surface thereof, a large contact area may be formed between the connection electrode 20ce, 30ce, 40ce, and 50ce and the light emitting stack structure. Accordingly, the connection electrodes 20ce, 30ce, 40ce, and 50ce may be more stably formed on the light emitting stack structure than those of a conventional light emitting device. For example, lengths L1, L2, L3, and L4 of one side surface that faces the outside of the connection electrodes 20ce, 30ce, 40ce, and 50ce may be different from lengths L1', L2', L3', and L4' of one side surface that faces toward a center of the light emitting device 100. More specifically, the length of one side surface of the connection electrode that faces the outside may be greater than that of another side surface that faces the center of the light emitting device 100. For example, a difference in lengths L and L' of two surfaces opposite to each other may be greater than a thickness (or height) of one of the light emitting stacks 20, 30, and 40. In this manner, the structure of the light emitting device 100 may be strengthened with a larger contact area between the connection electrodes 20ce, 30ce, 40ce, and 50ce and the light emitting stack structure. In addition, since the connection electrodes 20ce, 30ce, 40ce, and 50ce may be overlapped with at least one step that is formed on the side surface of the light emitting stack structure, heat generated in the light emitting stack structure may be dissipated to the outside more efficiently.

According to an exemplary embodiment, a difference between the length L1, L2, L3 or L4 of one side surface of the connection electrode that faces to the outside and the lengths L1', L2' L3', and L4' of the another side surface that faces the center of the light emitting device 100 may be about 3 In this case, the light emitting stack structure may be formed thinly, and in particular, the first light emitting stack 20 may have a thickness of about 1 the second light emitting stack 30 may have a thickness of about 0.7 the third light emitting stack 40 may have a thickness of about 0.7 and each of the first and second adhesive layers may have a thickness of about 0.2 $\mu m$ to about 0.3 but the inventive concepts are not limited thereto. According to another exemplary embodiment, a difference between the length L1, L2, L3 or L4 of one side surface of the connection electrode that faces to the outside and the lengths L L2' L3', and L4' of the another side surface that faces the center of the light emitting device 100 may be about 10 μm to about 16 In this case, the light emitting stack structure may be formed to be relatively thick and to have more stable structure, and in particular, the first light emitting stack 20 may have a thickness of about 4 μm to about 5 the second light emitting stack 30 may have a thickness of about 3 the third light emitting stack 40 may have a thickness of about 3 and each of the first and second adhesive layers may have a thickness of about 0.3 but the inventive concepts are not limited thereto. According to another exemplary embodiment, a difference between the length L1, L2, L3 or L4 of one side surface of the connection electrode that faces to the outside and the lengths L L2' L3', and L4' of the another side surface that faces the center of the light emitting device 100 may be about 25% of a length of a largest side surface. However, the inventive concepts are not limited to a particular difference in lengths between the two surfaces of the connection electrode opposite to each other, and the difference in lengths between the two surfaces opposite to each other may be changed in other exemplary embodiments.

In some exemplary embodiments, at least one of the connection electrodes 20ce, 30ce, 40ce, and 50ce may be overlapped with the side surface of each of the light emitting stacks 20, 30, and 40, and thus, the light emitting stacks 20, 30, and 40 may efficiently dissipate heat that is generated inside thereof. Further, when the connection electrodes 20ce, 30ce, 40ce, and 50ce include a reflective material such as metal, the connection electrodes 20ce, 30ce, 40ce, and 50ce may reflect light that is emitted from at least one of the light emitting stacks 20, 30, and 40, and thus, luminous efficiency may be improved.

In general, during the manufacturing process, an array of a plurality of light emitting devices is formed on a substrate. The substrate is cut along a scribing line to singularize (separate) each of the light emitting devices, and the light emitting device may be transferred to another substrate or a tape using various transfer techniques for further processing of the light emitting devices, such as packaging. In this case, when the light emitting device includes connection electrodes, such as metal bumps or pillars protruding outwardly from the light emitting structure, during a subsequent process, for example, a transfer stage, various problems may occur due to the structure of the light emitting device having outwardly protruding to the outside. In addition, when the light emitting device includes micro-LEDs having a surface area of about 10,000 μm$^2$ or less, about 4,000 μm$^2$ or less, or about 2,500 μm$^2$ or less, depending on the application, handling of the light emitting device may be more difficult due to its small form factor.

For example, when the connection electrode has a substantially elongated shape such as a rod, transferring the light emitting device using a conventional vacuum method may become difficult because the light emitting device may not have a sufficient suction area due to the protruding structure of the connection electrode. In addition, the exposed connection electrode may be directly affected by various stresses during a subsequent process, such as when the connection electrode contacts a manufacturing apparatus, which may damage the structure of the light emitting device. As another example, when the light emitting device is transferred by attaching an adhesive tape on the upper surface of the light emitting device (for example, a surface opposite to the substrate), a contact area between the light emitting device and the adhesive tape may be limited to the upper surface of the connection electrode. In this case, contrary to when the adhesive tape is attached to the lower surface of the light emitting device (for example, the substrate), an adhesive force of the light emitting device to the adhesive tape may be weakened, and the light emitting device may be undesirably separated from the adhesive tape while transferring the light emitting device. As another example, when transferring the light emitting device using a conventional pick-and-place method, a discharge pin may directly contact a portion of the light emitting device disposed between the connection electrodes, and thus, an upper structure of the light emitting structure may be damaged. In particular, the discharge pin may hit the center of the light emitting device, and cause physical damage to an upper light emitting stack of the light emitting device.

According to an exemplary embodiment, the protection layer 90 may be formed on the light emitting stack structure. More specifically, as shown in FIG. 1A, the protection layer 90 may be formed between the connection electrodes 20ce, 30ce, 40ce, and 50ce to cover at least the side surface of the light emitting stack structure. According to the illustrated exemplary embodiment, the protection layer 90 may expose side surfaces of the substrate 11, the first and second insulation layers 81 and 83, and the third light emitting stack 40. The protection layer 90 may be formed to be substantially flush with the upper surfaces of the connection electrodes 20ce, 30ce, 40ce, and 50ce, and may include an epoxy molding compound (EMC), which may be formed in various colors, such as black, white, or transparent. However, the inventive concepts are not limited thereto. For example, in some exemplary embodiments, the protection layer 90 may include polyimide (PID), and in this case, PID may be provided as a dry film rather than a liquid type to increase flatness when PID is applied to the light emitting stack structure. In some exemplary embodiments, the protection layer 90 may include a photosensitive substance. In this manner, the protection layer 90 may provide a sufficient contact area to the light emitting device 100 not only to protect the light emitting structure from external impacts that may be applied during subsequent processes, but also to facilitate handling during the subsequent transfer step. In addition, the protection layer 90 may prevent light leakage from the side surface of the light emitting device 100 to prevent or at least to suppress interference of light emitted from an adjacent light emitting device 100.

Figure 2:
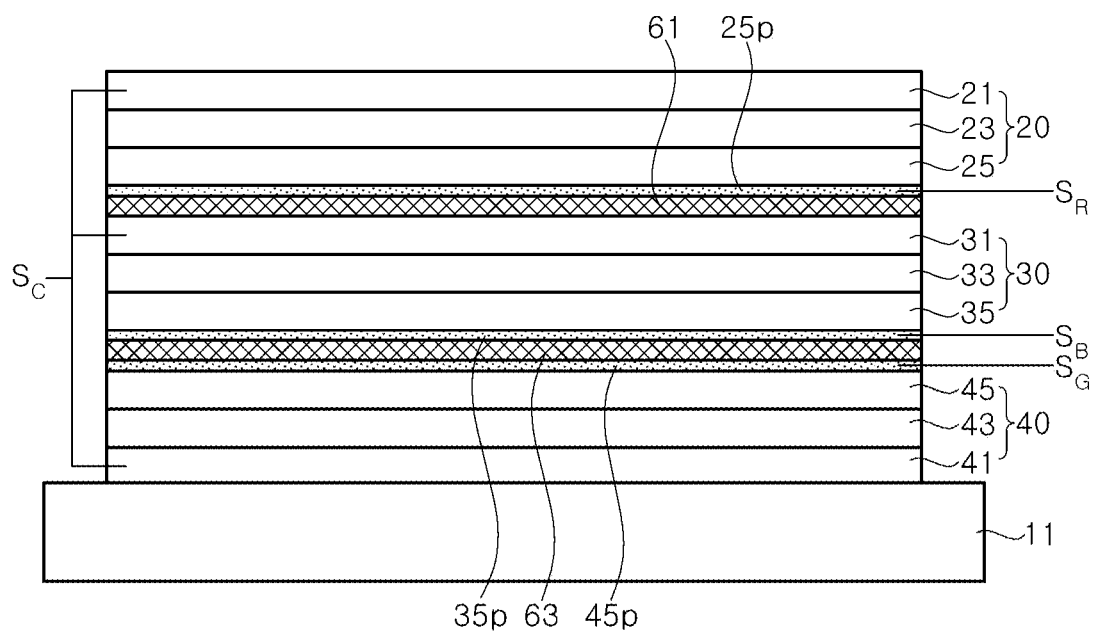
FIG. 2 is a schematic cross-sectional view of a light emitting stack structure according to an exemplary embodiment.

FIG. 2 is a schematic cross-sectional view of a light emitting stack structure according to an exemplary embodiment. Since the light emitting stack structure according to the illustrated exemplary embodiment is substantially the same as that included in the light emitting device 100 described above, repeated descriptions of substantially the same elements will be omitted to avoid redundancy.

Referring to FIG. 2, first, second, and third lower contact electrodes 25p, 35p, and 45p according to an exemplary embodiment may be connected to individual lines $S_R$, $S_G$, and $S_B$, respectively. First conductivity type semiconductor layers 21, 31, and 41 of first, second, and third light emitting stacks 20, 30, and 40 may be connected to a common line Sc. The common line Sc may be connected to the first conductivity type semiconductor layer 21 of the first light emitting stack 20 through a first upper contact electrode 21n.

According to an exemplary embodiment, different voltages may be applied to the first, second, and third light emitting stacks 20, 30, and 40 by including an n-common structure. For example, the first light emitting stack 20 emitting red light may be applied a relatively low voltage compared to those applied to the second and third light emitting stacks 30 and 40 emitting blue light and green light. Therefore, a voltage source suitable for each of the light emitting stacks may be individually used to reduce power loss. In the illustrated exemplary embodiment, the first, second, and third light emitting stacks 20, 30, and 40 may be individually controlled to selectively emit light by using the individual lines $S_R$, $S_G$, and $S_B$ and the common line Sc.

FIG. 2 exemplarily shows the light emitting stack structure having the n-common structure, but the inventive concepts are not limited thereto. For example, in some exemplary embodiments, the common line Sc may be electrically connected to the lower contact electrodes 25p, 35p, and 45p of the first, second, and third light emitting stacks 20, 30, and 40, and the individual lines $S_R$, $S_G$, and $S_B$ may be connected to the first conductivity type semiconductor layers 21, 31, and 41 of the first, second, and third light emitting stacks 20, 30, and 40, respectively.

The light emitting stack structure according to an exemplary embodiment may display light having various colors based on an operating state of each of the light emitting stacks 20, 30, and 40, whereas conventional light emitting devices may display a variety of colors in a combination of multiple light emitting cells that emit light having a single color. More specifically, conventional light emitting devices generally include light emitting cells spaced apart from one another along a two-dimensional plane and emitting light of different colors, for example, red, green, and blue, respectively, to realize a full color display. As such, a relatively large area may be occupied by conventional light emitting cells. However, the light emitting stack structure according to an exemplary embodiment may emit light of different colors by stacking a plurality of light emitting stacks 20, 30, and 40, and thus, the light emitting stack structure may provide a high level of integration and realize full color display through a smaller area than that of the conventional light emitting apparatus.

In addition, when the light emitting devices 100 are mounted on another substrate to manufacture a display apparatus, the number of devices to be mounted may be significantly reduced compared to the conventional light emitting device. As such, particularly when hundreds of thousands or millions of pixels are formed in one display apparatus, manufacturing of the display apparatus using the light emitting device 100 may be substantially simplified.

According to an exemplary embodiment, the light emitting stack structure may further include various additional elements to improve purity and efficiency of light emitted therefrom. For example, in some exemplary embodiments, a wavelength pass filter may be disposed between the light emitting stacks. In some exemplary embodiments, an irregularity portion may be formed on a light emission surface of at least one of the light emitting stacks to balance brightness of light between the light emitting stacks. For example, luminous intensity of green light needs to be increased to make the RGB mixing ratio close to 3:6:1. As such, irregularities may be formed on the surface of the substrate 11.

Hereinafter, a method of forming the light emitting device 100 according to an exemplary embodiment will be described with reference to the accompanying drawings.

FIGS. 3A, 4A, 5A, 6A, 7A, and 8A are plan views illustrating a process of manufacturing the light emitting device of FIG. 1A according to an exemplary embodiment. FIGS. 3B, 4B, 5B, 6B, 7B, and 8B are cross-sectional views taken along the line A-A' of the corresponding plan views shown in FIGS. 3A, 4A, 5A, 6A, 7A, and 8A according to an exemplary embodiment. FIGS. 4C, 5C, 6C, 7C, and 8C are cross-sectional views taken along the line B-B' of the corresponding plan views shown in FIGS. 3A, 4A, 5A, 6A, 7A, and 8A according to an exemplary embodiment. FIGS. 9, 10, 11, 12, and 13 are cross-sectional views schematically showing a process of manufacturing the light emitting device of FIG. 1A according to an exemplary embodiment.

Referring back to FIG. 2, the first conductivity type semiconductor layer 41, the third active layer 43, and the second conductivity type semiconductor layer 45 of the third light emitting stack 40 may be sequentially grown on the substrate 11 by, for example, a metal organic chemical vapor deposition (MOCVD) method or a molecular beam epitaxy (MBE) method. The third lower contact electrode 45p may be formed on the third p-type semiconductor layer 45 by, for example, a physical vapor deposition or chemical vapor deposition method, and may include transparent conductive oxide (TCO), such as $SnO$, $InO_2$, $ZnO$, ITO, ITZO, or the like. When the third light emitting stack 40 emits green light according to an exemplary embodiment, the substrate 11 may include $Al_2O_3$ (for example, a sapphire substrate), and the third lower contact electrode 45p may include transparent conductive oxide (TCO), such as tin oxide. The first and second light emitting stacks 20 and 30 may be similarly formed by sequentially growing the first conductivity type semiconductor layer, the active layer, and the second conductivity type semiconductor layer on a temporary substrate, respectively. The lower contact electrodes including transparent conductive oxide (TCO) may be formed by, for example, a physical vapor deposition or chemical vapor deposition method on the second conductivity type semiconductor layer, respectively. In addition, the first and second light emitting stacks 20 and 30 may be coupled to each other with the first adhesive layer 61 interposed therebetween, and at least one of the temporary substrates of the first and second light emitting stacks 20 and 30 may be removed by a laser lift-off process, a chemical process, a mechanical process, or the like. The first and second light emitting stacks 20 and 30 may then be coupled to the third light emitting stack 40 with the second adhesive layer 63 therebetween, and the remaining temporary substrate of the first or second light emitting stacks 20 and 30 may be removed by a laser lift-off process, a chemical process, a mechanical process, or the like.

Figure 3A:
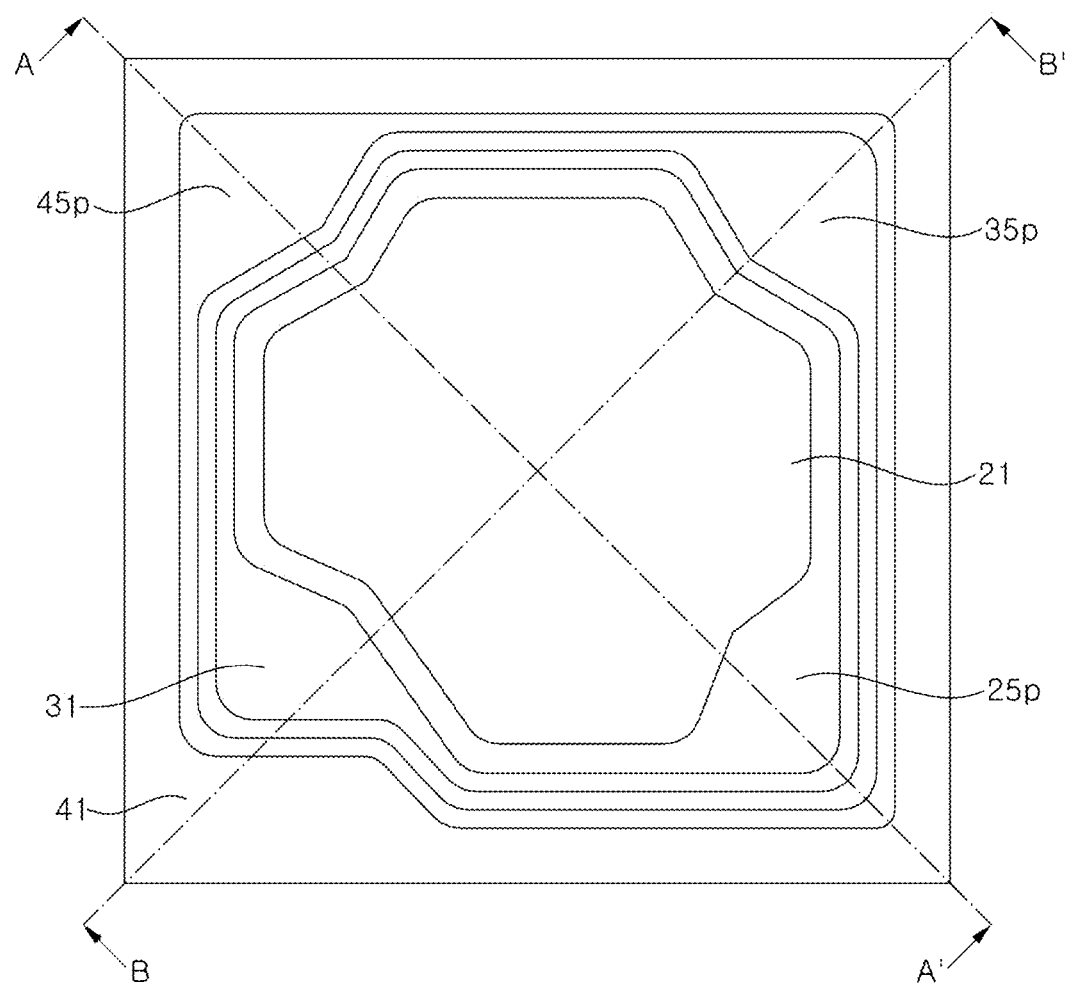
FIGS. 3A, 4A, 5A, 6A, 7A, and 8A are plan views illustrating a process of manufacturing the light emitting device of FIG. 1A according to an exemplary embodiment.
Figure 3B:
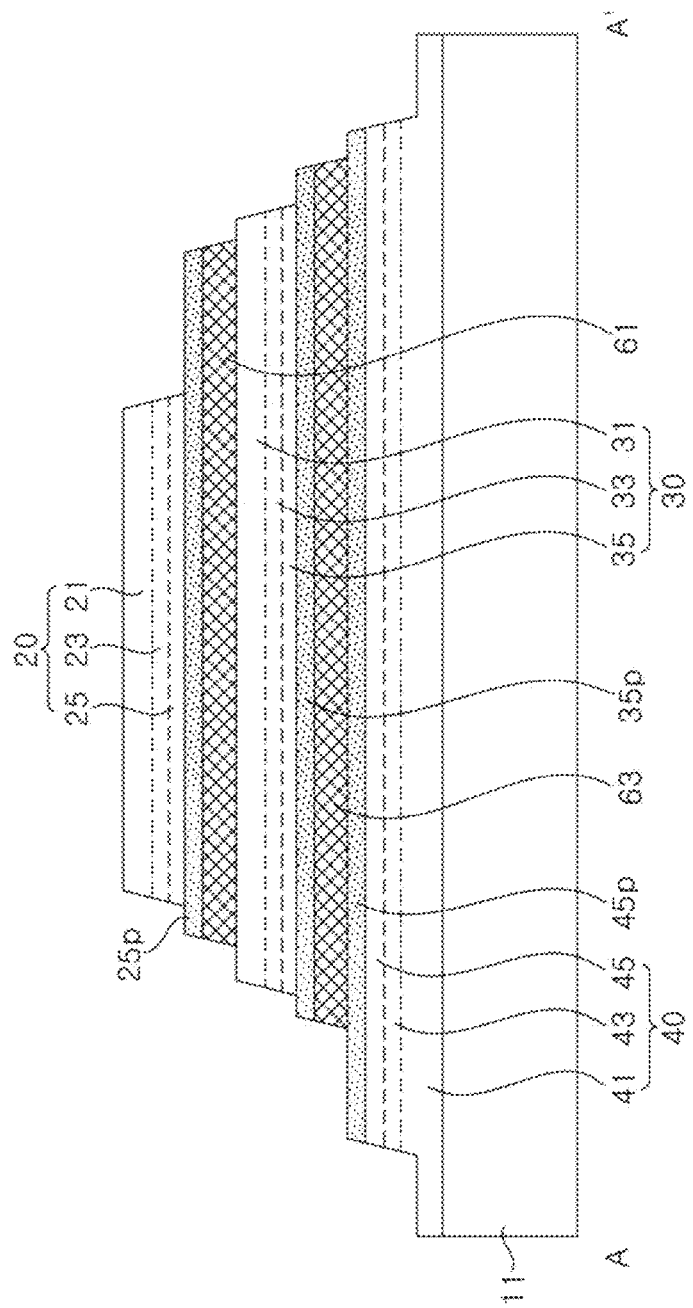
FIGS. 3B, 4B, 5B, 6B, 7B, and 8B are cross-sectional views taken along line A-A' of the corresponding plan views shown in FIGS. 3A, 4A, 5A, 6A, 7A, and 8A according to an exemplary embodiment.
Figure 3C:
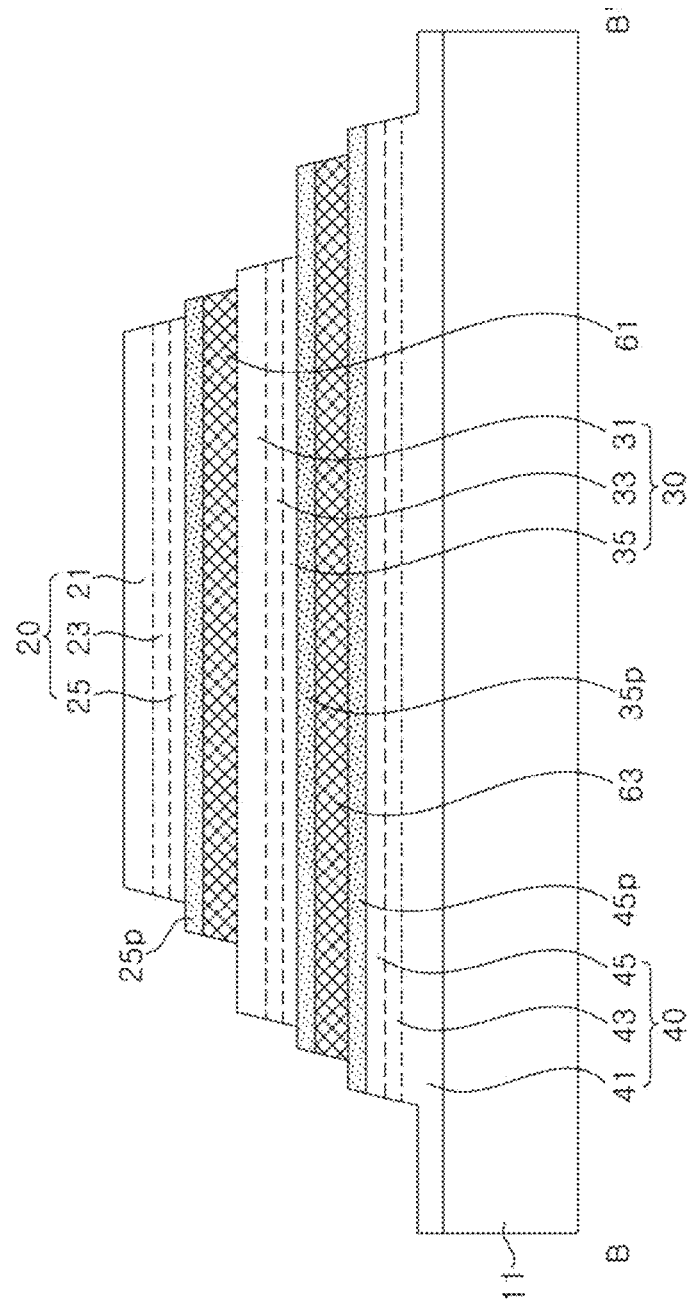
FIGS. 3C, 4C, 5C, 6C, 7C, and 8C are cross-sectional views taken along line B-B' of the corresponding plan views shown in FIGS. 3A, 4A, 5A, 6A, 7A, and 8A according to an exemplary embodiment.

Referring to FIGS. 3A, 3B, and 3C, various portions of each of the first, second, and third light emitting stacks 20, 30, and 40 may be patterned through an etching process or the like to form a first conductivity type semiconductor layer 21, a first lower contact electrode 25p, a first conductivity type semiconductor layer 31, a second lower contact electrode 35p, a third lower contact electrode 45p, and a first conductivity type semiconductor layer 41. According to the illustrated exemplary embodiment, the first light emitting stack 20 has the smallest area among the light emitting stacks 20, 30, and 40. The third light emitting stack 40 may have the largest area among the light emitting stacks 20, 30, and 40, and thus, luminous intensity of the third light emitting stack 40 may be relatively increased. However, the inventive concepts are not particularly limited to the relative sizes of the light emitting stacks 20, 30, and 40.

Figure 4A:
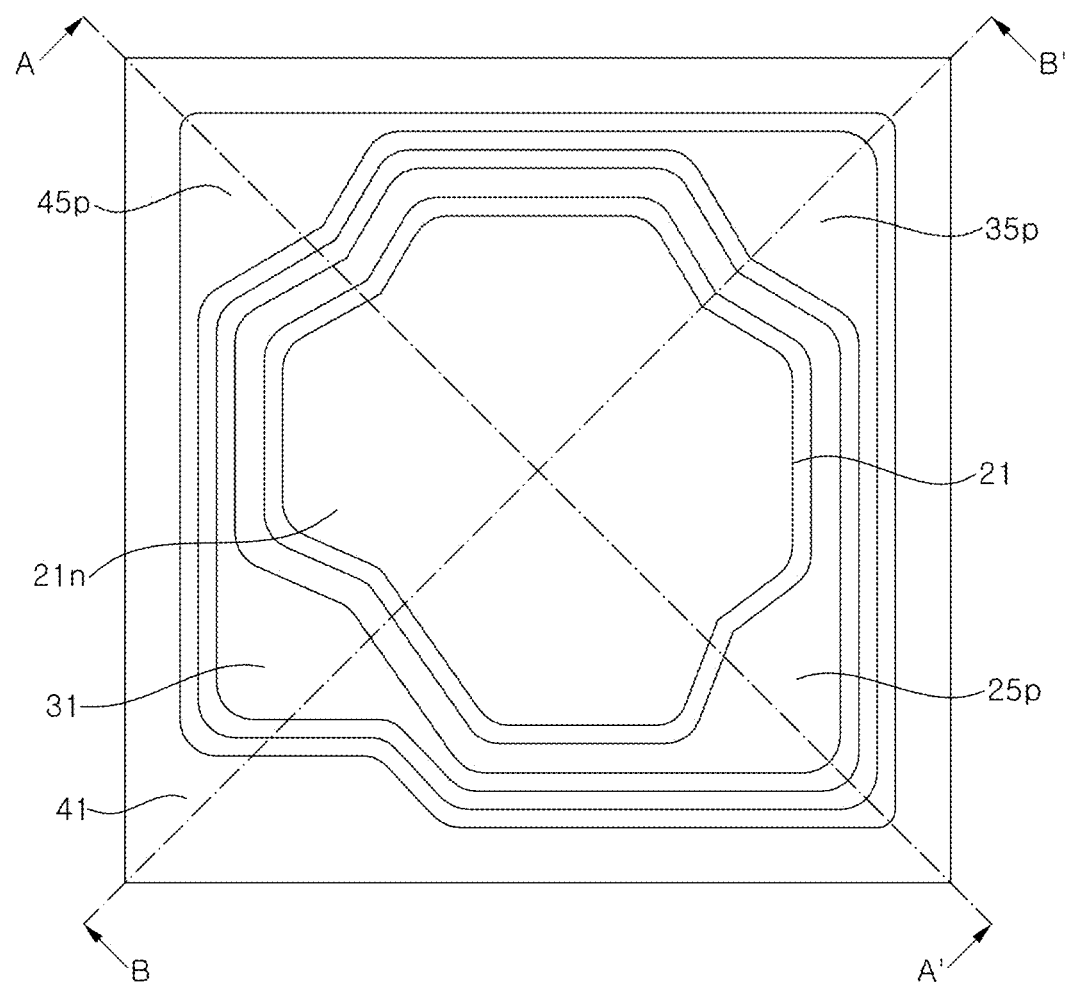
Figure 4B:
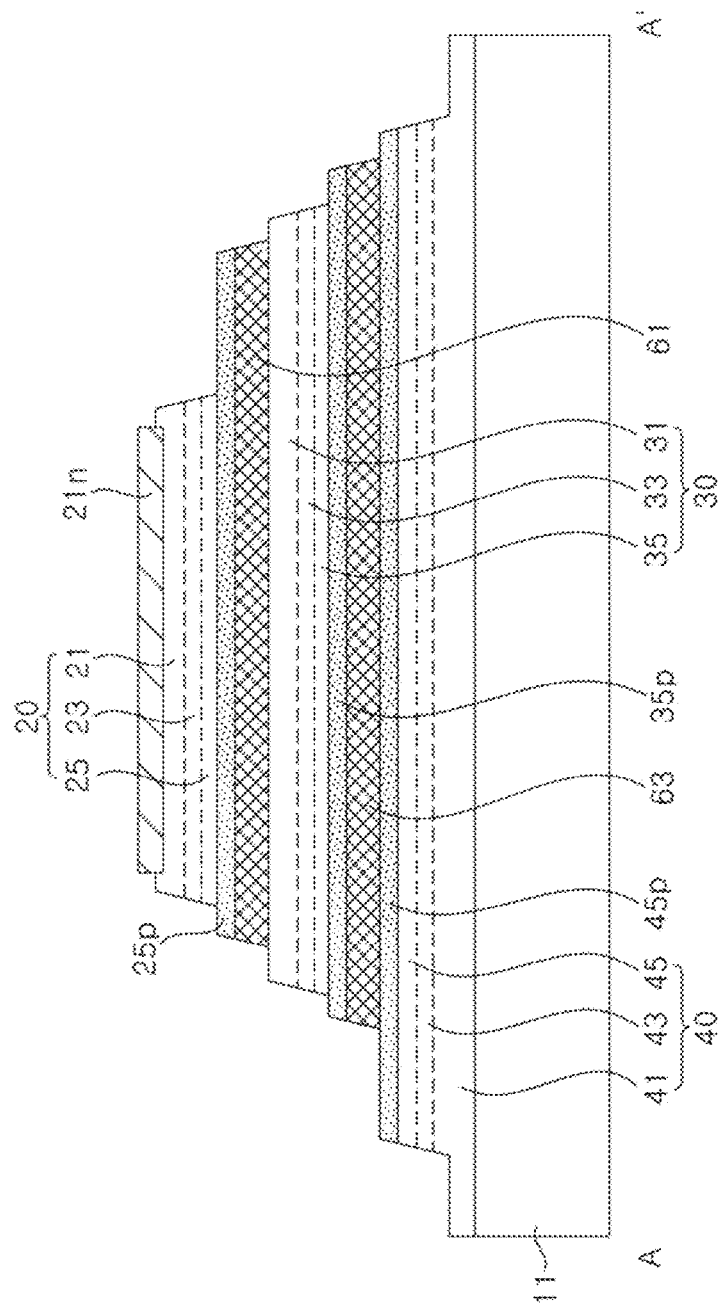
Figure 4C:
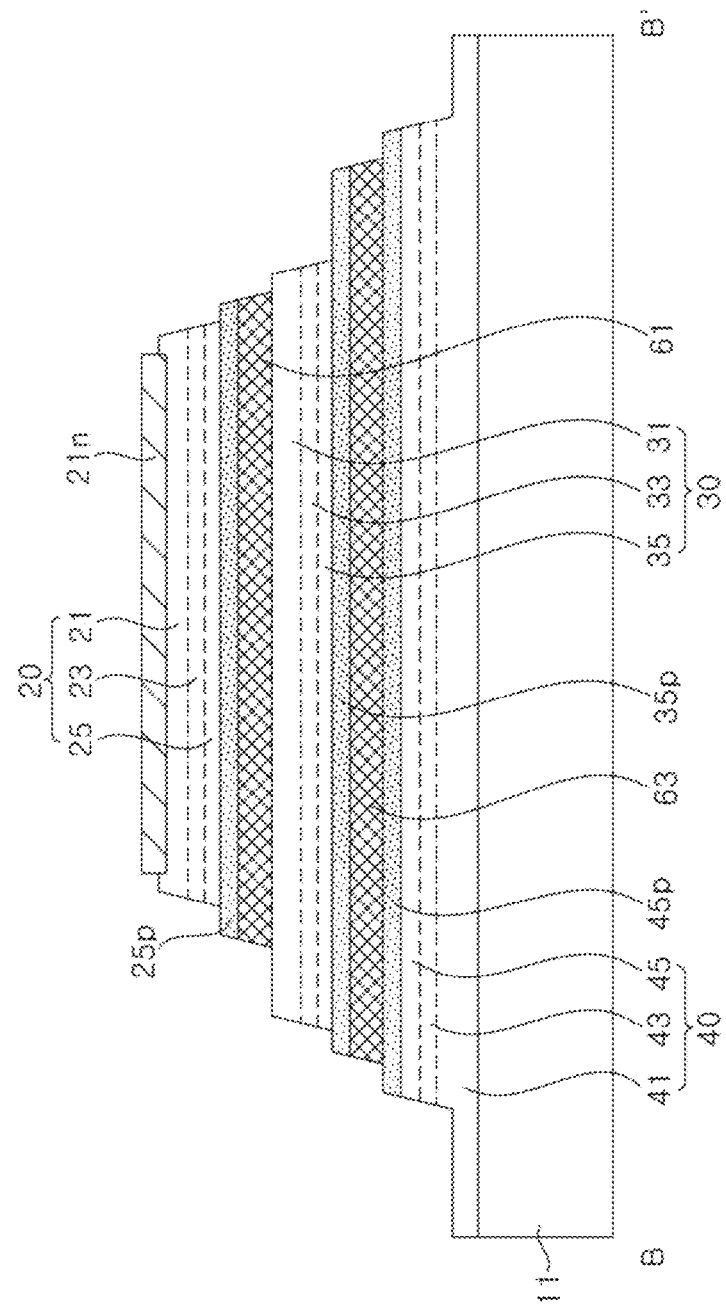

Referring to FIGS. 4A, 4B, and 4C, a portion of an upper surface of the first conductivity type semiconductor layer 21 of the first light emitting stack 20 may be patterned through wet etching or the like to form a first upper contact electrode 21n. As described above, the first upper contact electrode 21n is formed to have a thickness of about 100 nm in the recessed region of the first conductivity type semiconductor layer 21, to improve an ohmic contact therebetween.

Figure 5A:
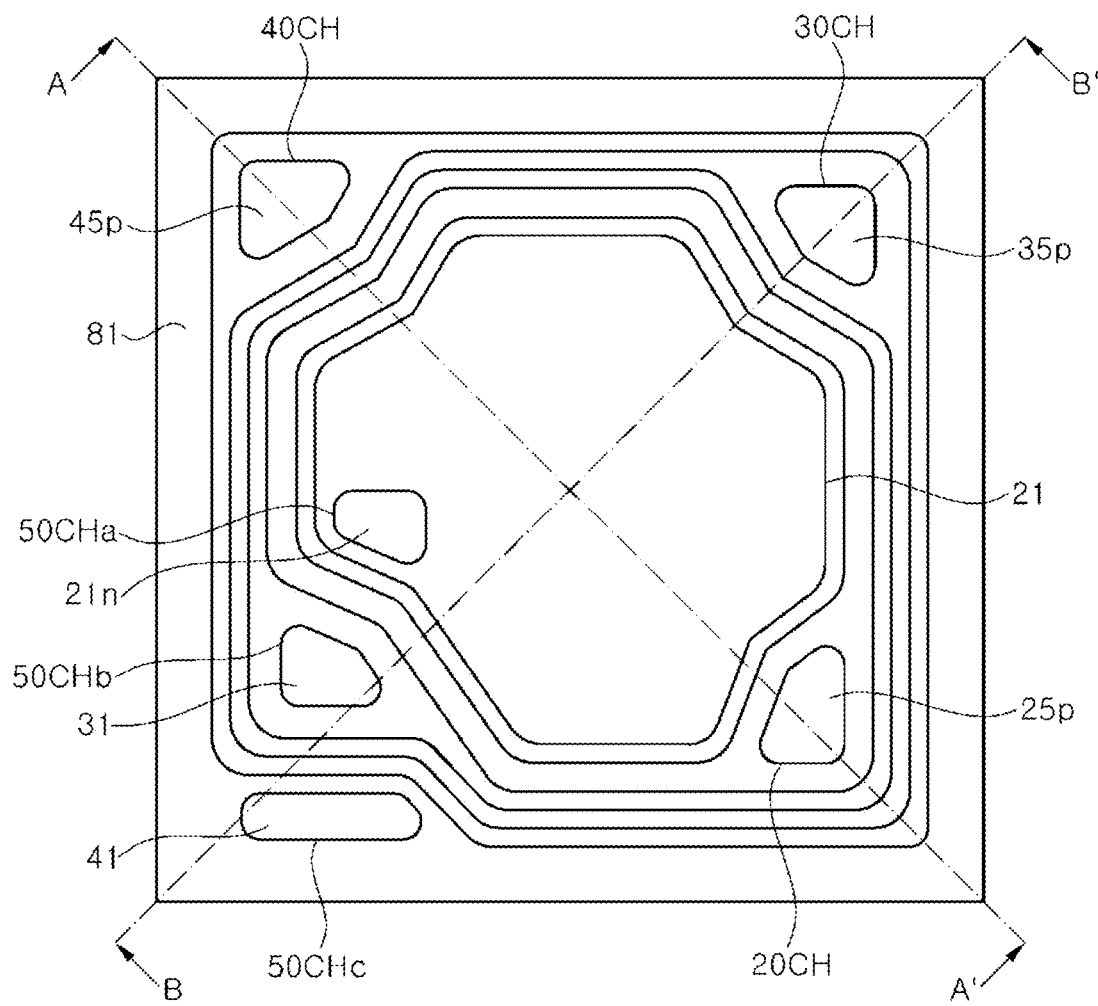
Figure 5B:
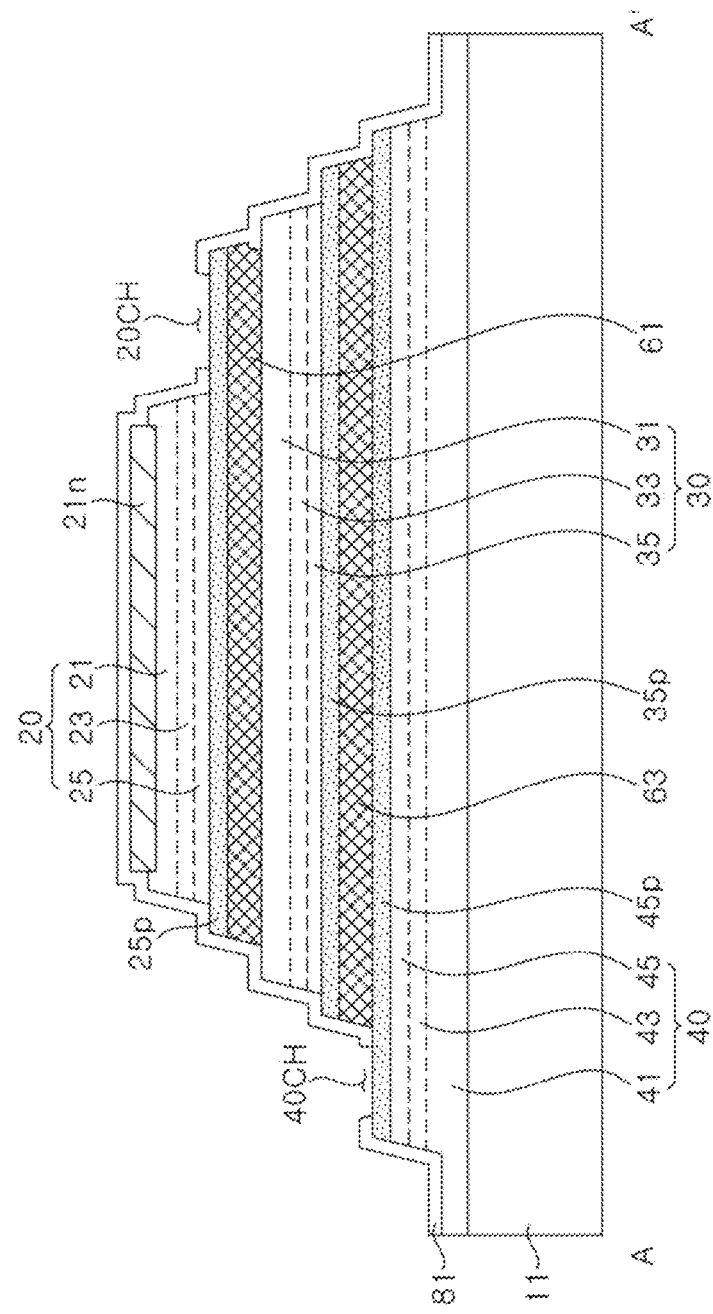
Figure 5C:
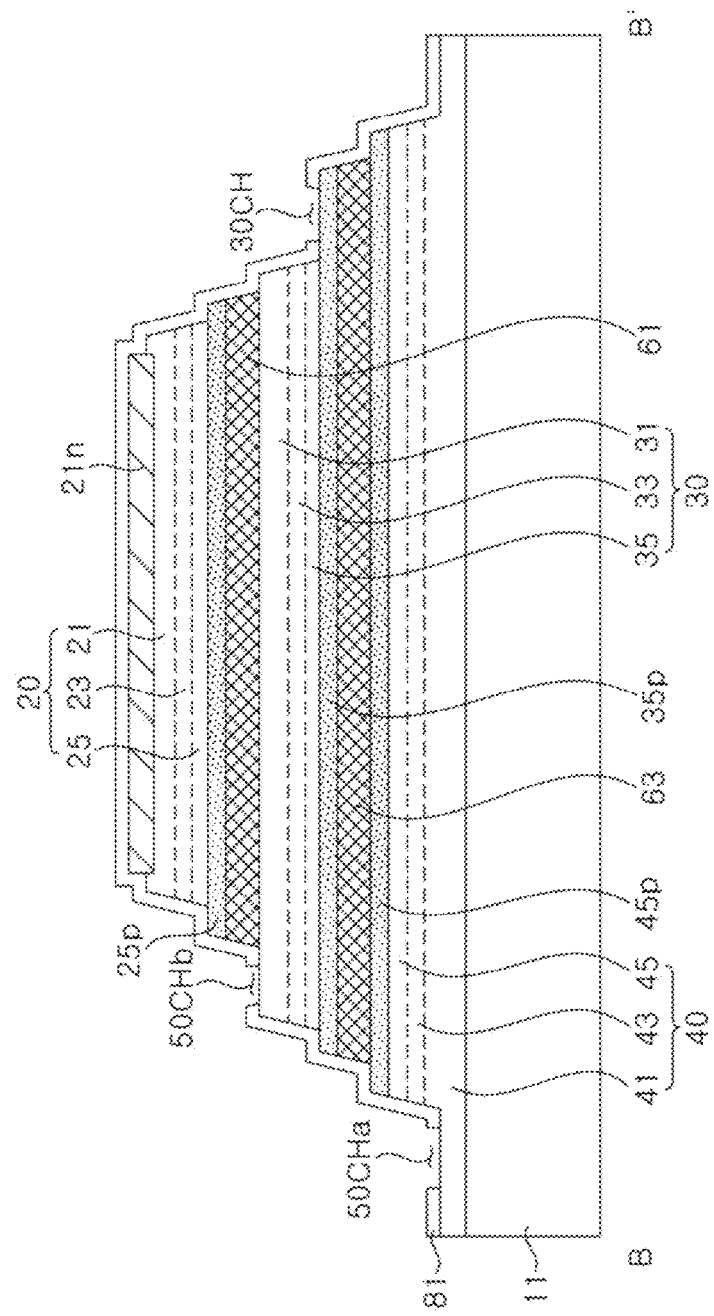

Referring to FIGS. 5A, 5B, and 5C, a first insulation layer 81 may be formed to cover the light emitting stacks 20, 30, and 40, and a portion of the first insulation layer 81 may be removed to form first, second, third, and fourth contact holes 20CH, 30CH, 40CH, and 50CH. The first contact hole 20CH is defined on the first lower contact electrode 25p to expose a portion of the first lower contact electrode 25p. The second contact hole 30CH is defined on the second lower contact electrode 35p and may expose a portion of the second lower contact electrode 35p. The third contact hole 40CH is defined on the third lower contact electrode 45p and may expose a portion of the third lower contact electrode 45p.

The fourth contact hole 50CH provides a passage for electrical connection to the first conductivity type semiconductor layers 21, 31, and 41 of the first, second, and third light emitting stacks 20, 30, and 40. The fourth contact hole 50CH may include a first sub-contact hole 50CHa, a second sub-contact hole 50CHb, and a third sub-contact hole 50CHc. The first sub-contact hole 50CHa may be defined on the first conductivity type semiconductor layer 21 to expose a portion of the first upper contact electrode 21n, and the second sub-contact hole 50CHb may be defined on the first conductivity type semiconductor layer 31 to expose a portion of the first conductivity type semiconductor layer 31, and the third sub-contact hole 50CHc may be defined on the first conductivity type semiconductor layer 41 to expose a portion of the first conductivity type semiconductor layer 41.

Figure 6A:
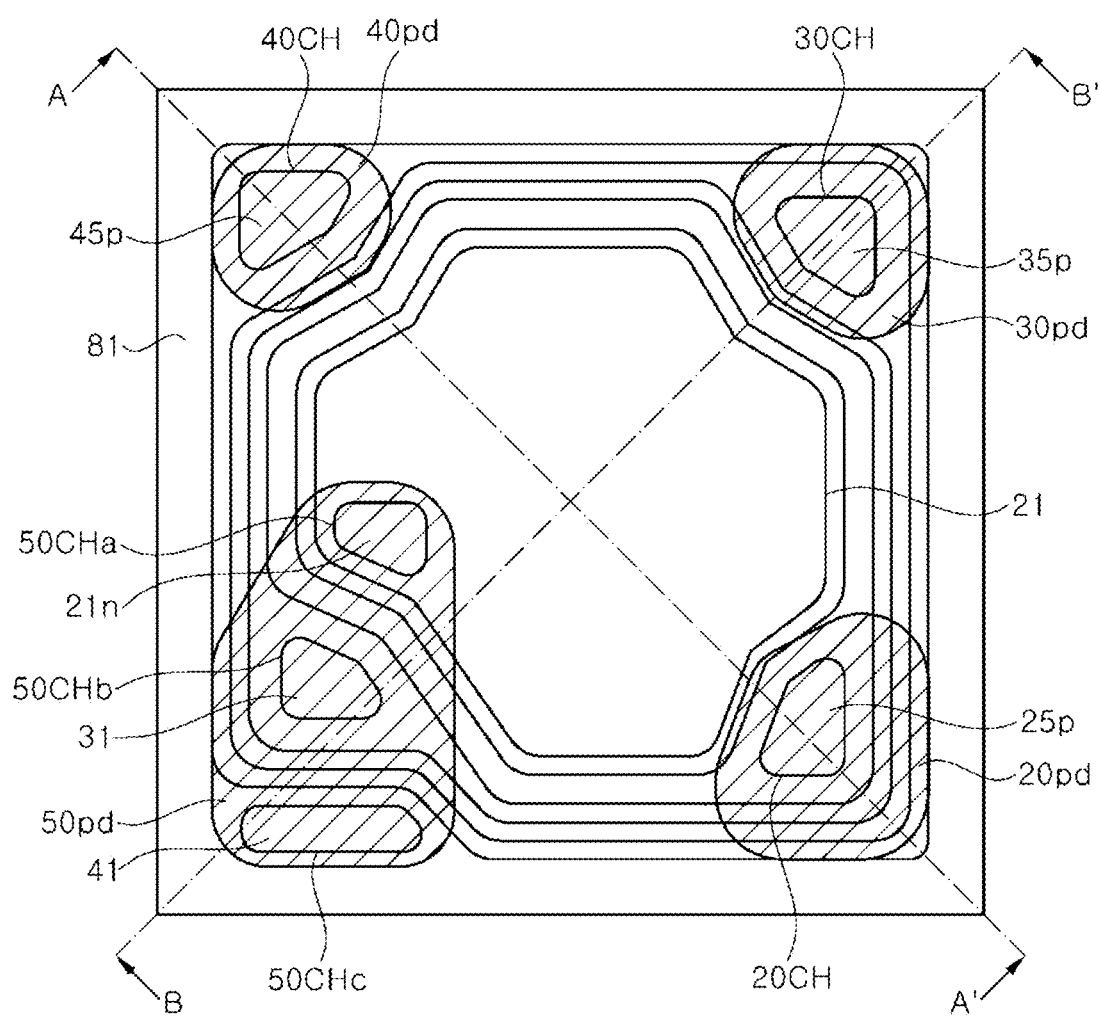
Figure 6B:
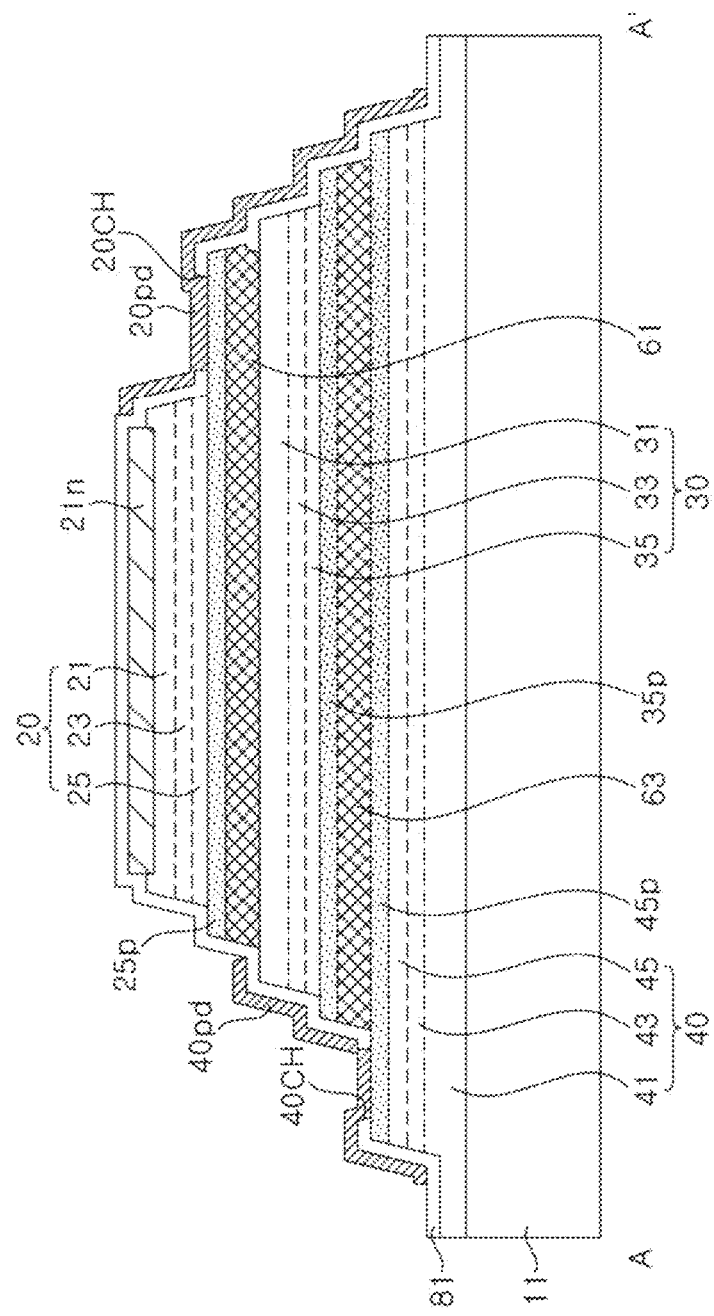
Figure 6C:
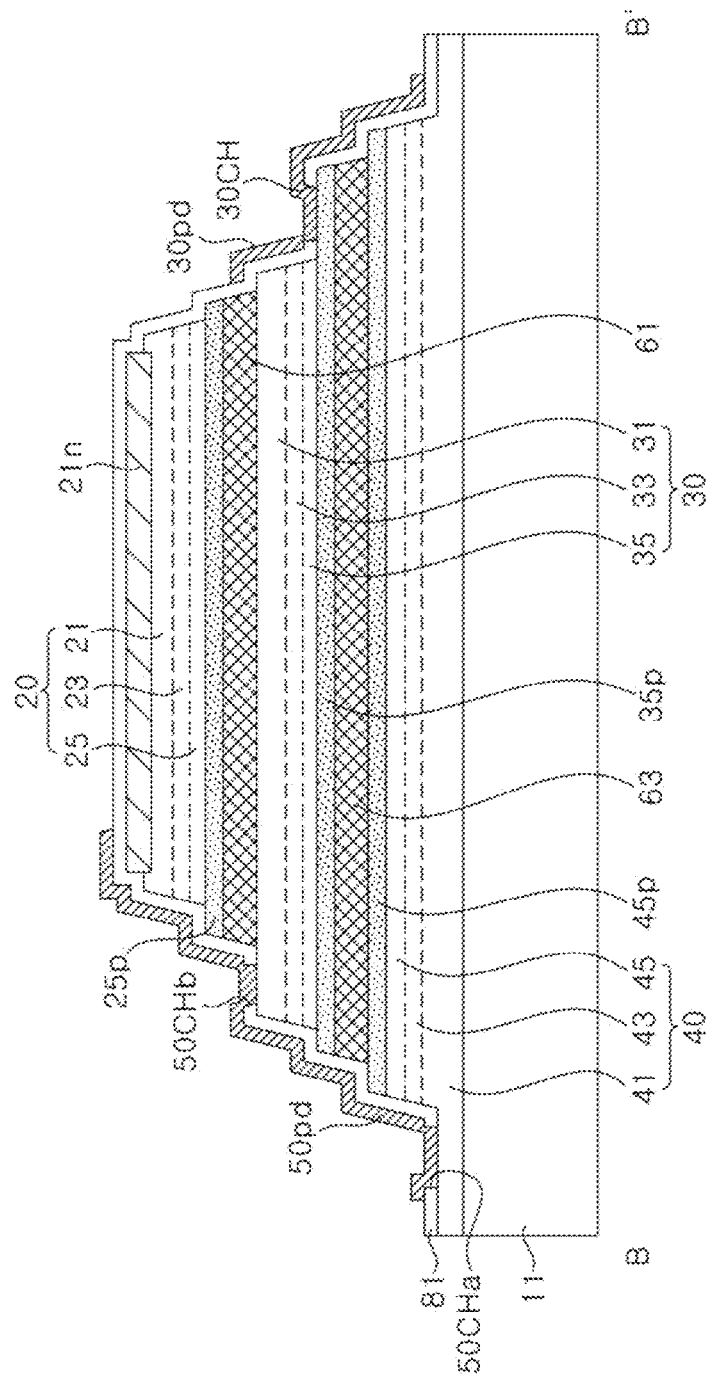

Referring to FIGS. 6A, 6B, and 6C, first, second, third, and fourth pads 20pd, 30pd, 40pd, and 50pd are formed on the first insulation layer 81 including the first, second, third, and fourth contact holes 20CH, 30CH, 40CH, and 50CH. The first, second, third, and fourth pads 20pd, 30pd, 40pd, and 50pd may be formed, for example, by forming a conductive layer on substantially the entire surface of the structure, and by patterning the conductive layer using a photolithography process.

The first pad 20pd may be formed to overlap with a region where the first contact hole 20CH is formed, and may be connected to the first lower contact electrode 25p through the first contact hole 20CH. The second pad 30pd may be formed to overlap with a region where the second contact hole 30CH is formed, and may be connected to the second lower contact electrode 35p through the second contact hole 30CH. The third pad 40pd may be formed to overlap with a region where the third contact hole 40CH is formed, and may be connected to the third lower contact electrode 45p through the third contact hole 40CH. The fourth pad 50pd may be formed to overlap with a region where the fourth contact hole 50CH is formed, particularly regions where the first, second, and third sub-contact holes 50CHa, 50CHb, and 50CHc are formed, and may be electrically connected to the first conductivity type semiconductor layers 21, 31, and 41 of the light emitting stacks 20, 30, and 40.

Figure 7A:
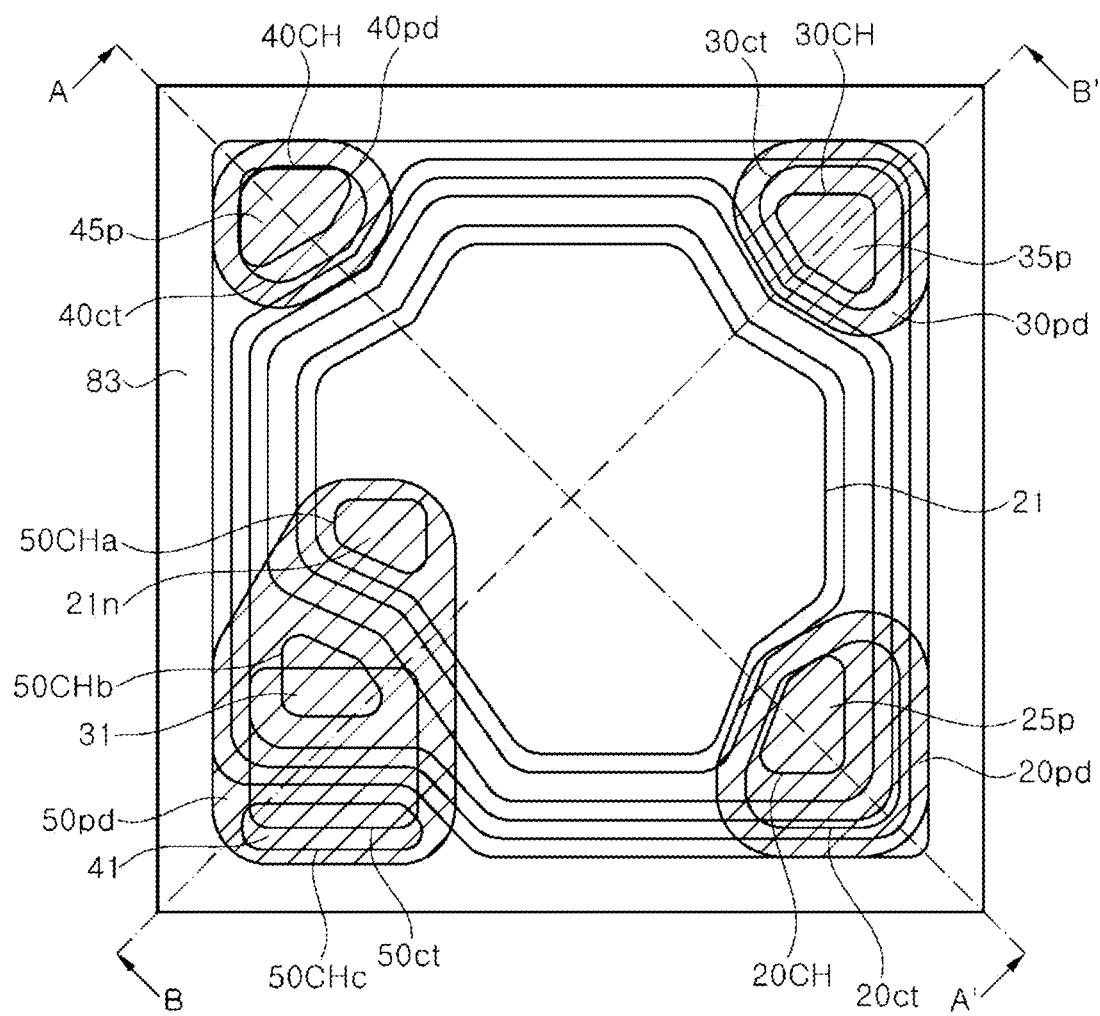
Figure 7B:
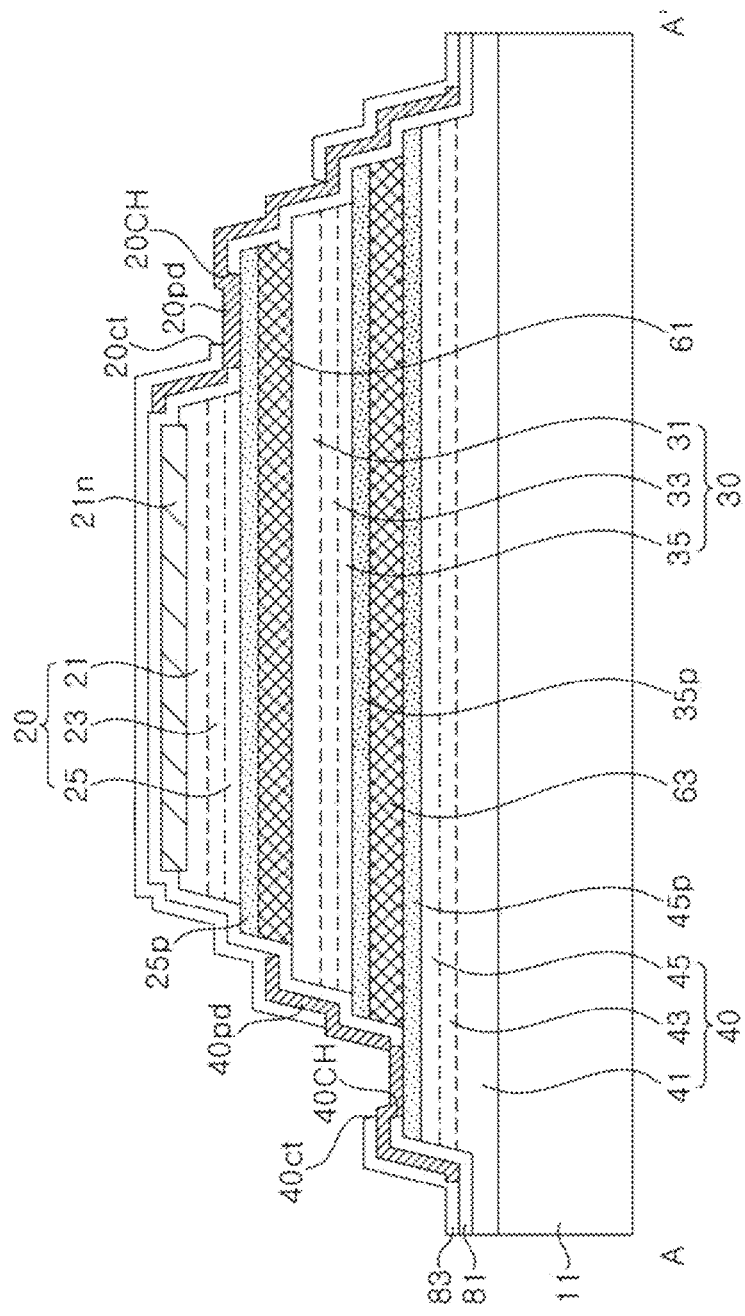
Figure 7C:
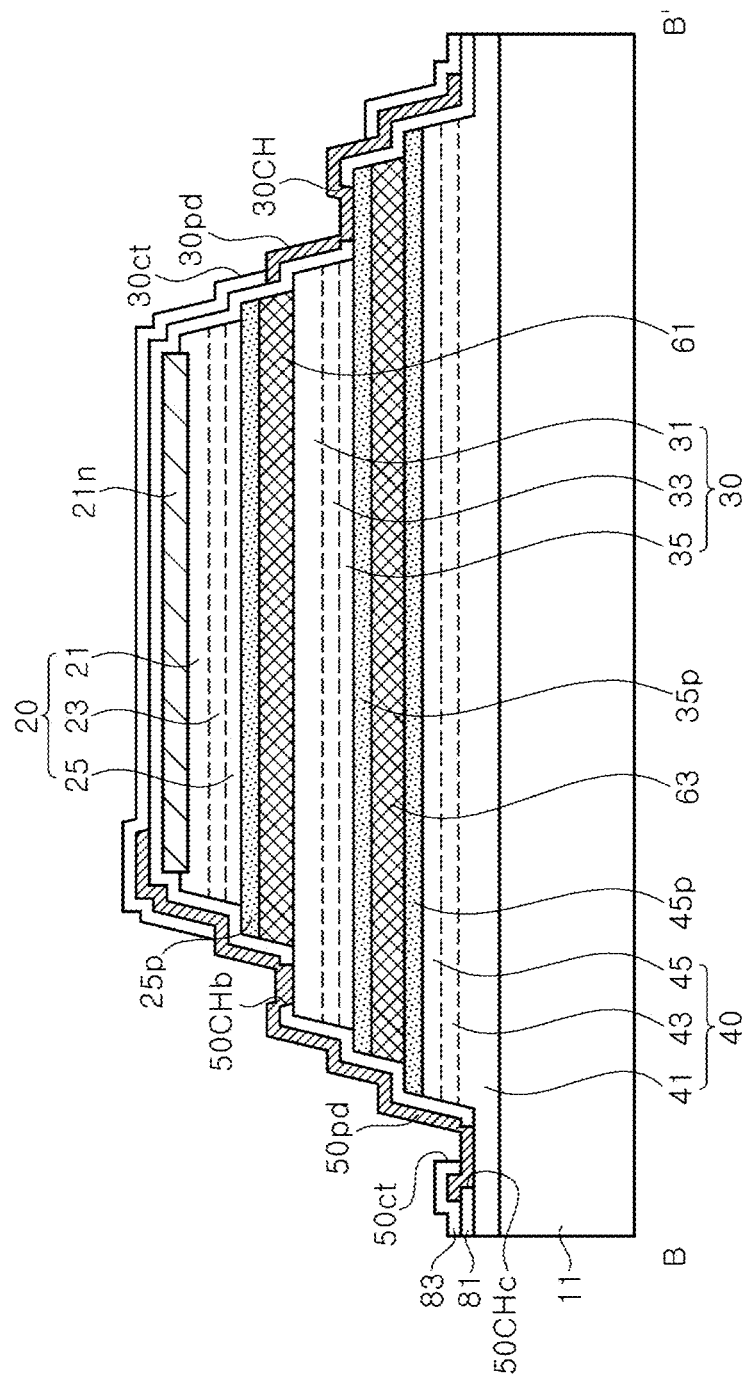

Referring to FIGS. 7A, 7B, and 7C, a second insulation layer 83 may be formed on the first insulation layer 81. The second insulation layer 83 may include silicon oxide and/or silicon nitride. However, the inventive concepts are not limited thereto, and in some exemplary embodiments, the first and second insulation layers 81 and 83 may include inorganic materials. Subsequently, the second insulation layer 83 may be patterned and first, second, third, and fourth through holes 20ct, 30ct, 40ct, and 50ct exposing the first, second, third, and fourth pads 20pd, 30pd, 40pd, and 50pd may be formed.

The first through hole 20ct formed on the first pad 20pd exposes a portion of the first pad 20pd. The second through hole 30ct formed on the second pad 30pd exposes a portion of the second pad 30pd. The third through hole 40ct formed on the third pad 40pd exposes a portion of the third pad 40pd. The fourth through hole 50ct formed on the fourth pad 50pd exposes a portion of the fourth pad 50pd. In the illustrated exemplary embodiment, the first, second, third, and fourth through holes 20ct, 30ct, 40ct, and 50ct may be defined within regions where the first, second, third, and fourth pads 20pd, 30pd, 40pd, and 50pd are formed, respectively.

Figure 8A:
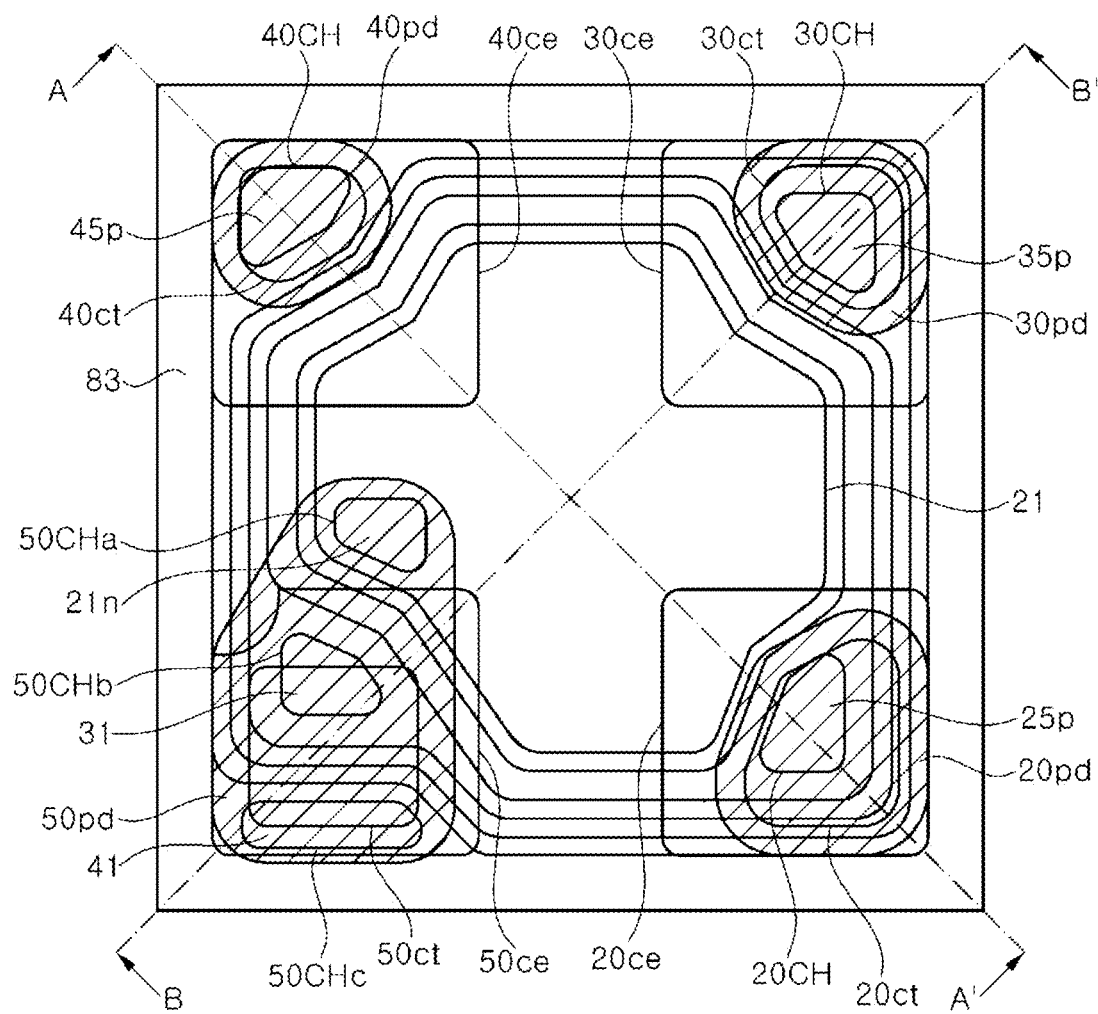
Figure 8B:
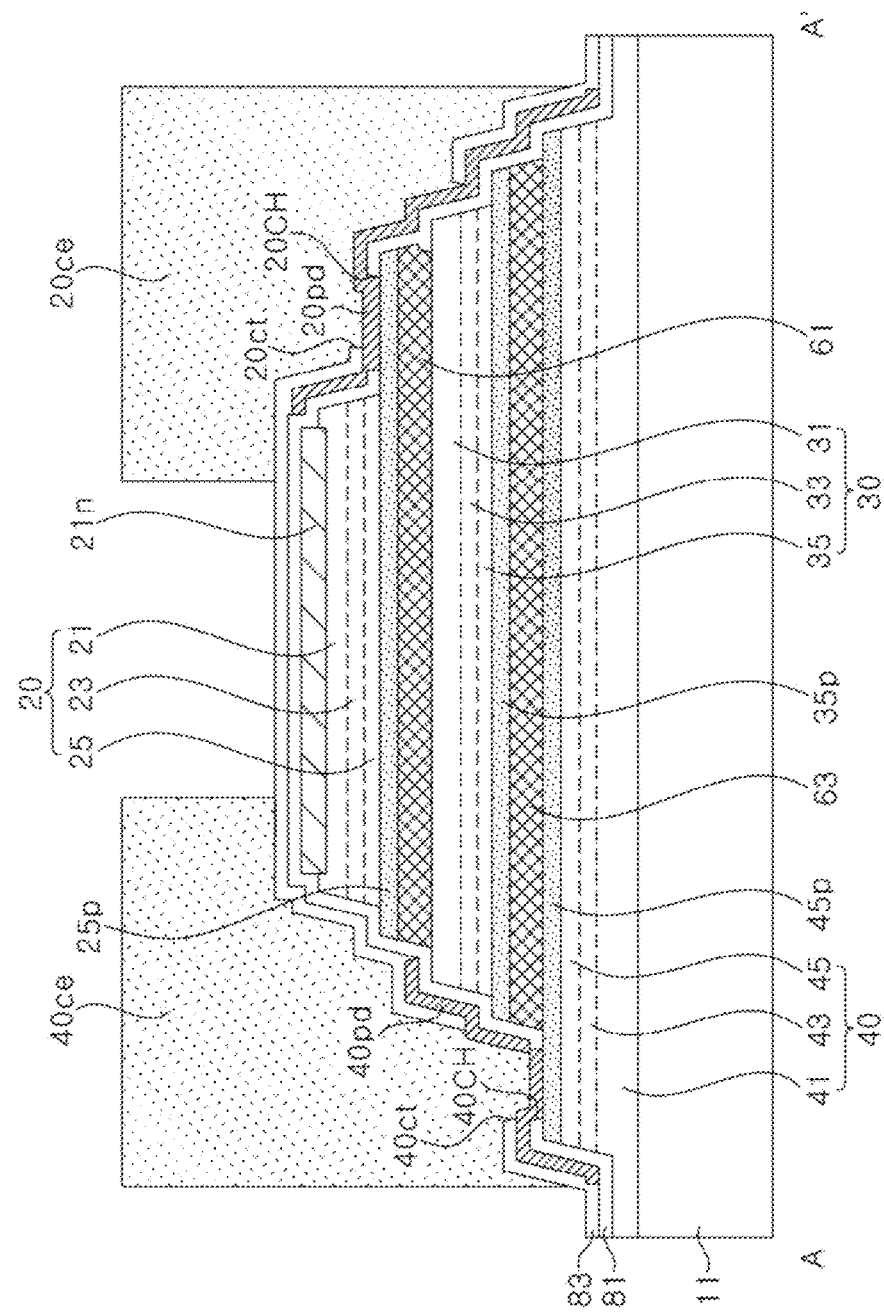
Figure 8C:
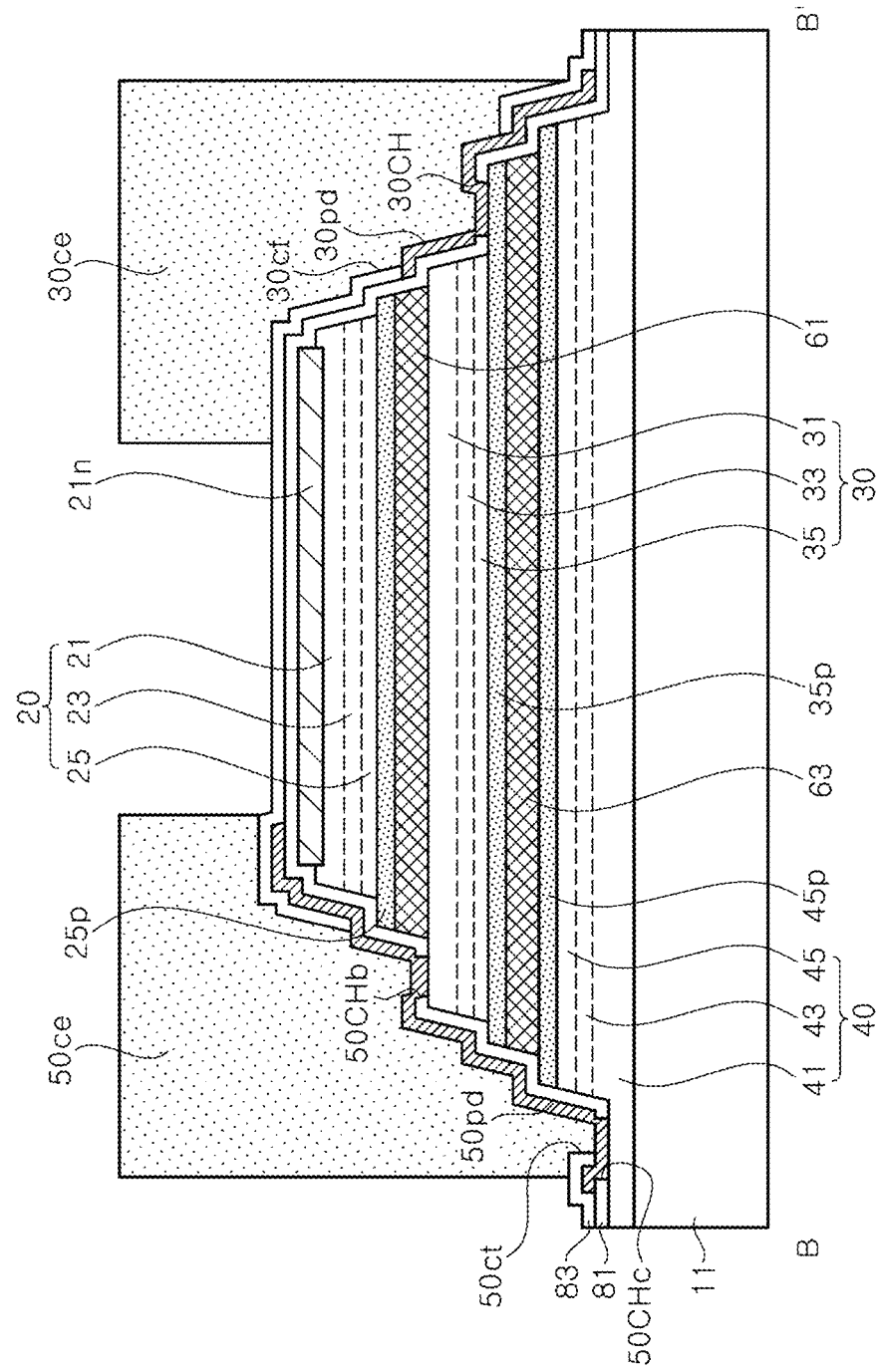

Referring to FIGS. 8A, 8B, and 8C, first, second, third and fourth connection electrodes 20ce, 30ce, 40ce, and 50ce are formed on the second insulation layer 83 on which the first, second, third and fourth through holes 20ct, 30ct, 40ct, and 50ct are formed. The first connection electrode 20ce may be formed to overlap with a region where the first through hole 20ct is formed, and may be connected to the first pad 20pd through the first through hole 20ct. The second connection electrode 30ce may be formed to overlap with a region where the second through hole 30ct is formed, and may be connected to the second pad 30pd through the second through hole 30ct. The third connection electrode 40ce may be formed to overlap with a region where the third through hole 40ct is formed, and may be connected to the third pad 40pd through the third through hole 40ct. The fourth connection electrode 50ce may be formed to overlap with a region where the fourth through hole 50ct is formed, and may be connected to the fourth pad 50pd through the fourth through hole 50ct.

The first, second, third, and fourth connection electrodes 20ce, 30ce, 40ce, and 50ce are formed on the light emitting stack structure while being spaced apart from each other. The first, second, third, and fourth connection electrodes 20ce, 30ce, 40ce, and 50ce may be electrically connected to the first, second, third, and fourth pads 20pd, 30pd, 40pd, and 50pd, respectively, and transmit an external signal to each of the light emitting stacks 20, 30, and 40.

A method of forming the first, second, third, and fourth connection electrodes 20ce, 30ce, 40ce, and 50ce is not particularly limited. For example, according to an exemplary embodiment, a seed layer is deposited as a conductive surface on the light emitting stack structure, and a photoresist pattern may be formed so that the seed layer is exposed at a location where connection electrodes will be formed. According to an exemplary embodiment, the seed layer may be deposited to have a thickness of about 1000 Å, but the inventive concepts are not limited thereto. Subsequently, the seed layer may be plated with metal, such as Cu, Ni, Ti, Sb, Zn, Mo, Co, Sn, Ag or an alloy thereof, and the photoresist pattern and the seed layer that remaining between the connection electrodes may be removed. In some exemplary embodiments, to prevent or at least inhibit oxidation of the plated metal, an additional metal may be deposited or plated with electroless nickel immersion gold (ENIG) or the like on the plated metal (for example, connection electrodes). In some exemplary embodiments, the seed layer may be retained on each of the connection electrodes.

According to the illustrated exemplary embodiment, each of the connection electrodes 20ce, 30ce, 40ce, and 50ce may have a substantially elongated shape to be spaced apart from the substrate 11. In another exemplary embodiment, the connection electrodes 20ce, 30ce, and 40ce may include two or more metals or a plurality of different metal layers to reduce stress from the elongated shape of the connection electrodes 20ce, 30ce, 40ce, and 50ce. However, the inventive concepts are not limited to a specific shape of the connection electrodes 20ce, 30ce, 40ce, and 50ce, and in some exemplary embodiments, the connection electrode may have various shapes.

As shown in the drawings, each of the connection electrodes 20ce, 30ce, 40ce, and 50ce may have a substantially flat upper surface to facilitate electrical connection between the light emitting stack structure and outer lines or electrodes. The connection electrodes 20ce, 30ce, 40ce, and 50ce may be overlapped with at least one step formed on the side surface of the light emitting stack structure. In this manner, a lower surface of the connection electrode may provide a larger contact area between the connection electrodes 20ce, 30ce, 40ce and 50ce and the light emitting stack structure than an upper surface thereof, and thus, the light emitting device 100 along with a protection layer 90 may have a more stable structure that is capable of withstanding various subsequent processes. In this case, a length L (L1 to L4) of one side surface of the connection electrodes 20ce, 30ce, 40ce, and 50ce that faces to the outside and a length L' (L1' to L4') of another surface that faces a center of the light emitting device 100 may be different. For example, a difference in lengths between two surfaces of the connection electrode opposite to each other may be about 3 μm to about 16 μm, without being limited thereto.

Then, the protection layer 90 is disposed between the connection electrodes 20ce, 30ce, 40ce, and 50ce. The protection layer 90 may be formed to be substantially flush with the upper surfaces of the connection electrodes 20ce, 30ce, 40ce, and 50ce by a polishing process or the like. According to an exemplary embodiment, the protection layer 90 may include a black epoxy molding compound (EMC), but the inventive concepts are not limited thereto. For example, in some exemplary embodiments, the protection layer 90 may include a photosensitive polyimide dry film (PID). In this manner, the protection layer 90 may provide a sufficient contact area to the light emitting device 100 not only to protect the light emitting structure from external impacts that may be applied during subsequent processes, but also to facilitate handling during a subsequent transferring step. In addition, the protection layer 90 may prevent light leakage from the side surface of the light emitting device 100 to prevent or at least to suppress interference of light emitted from adjacent light emitting devices 100.

Figure 9:
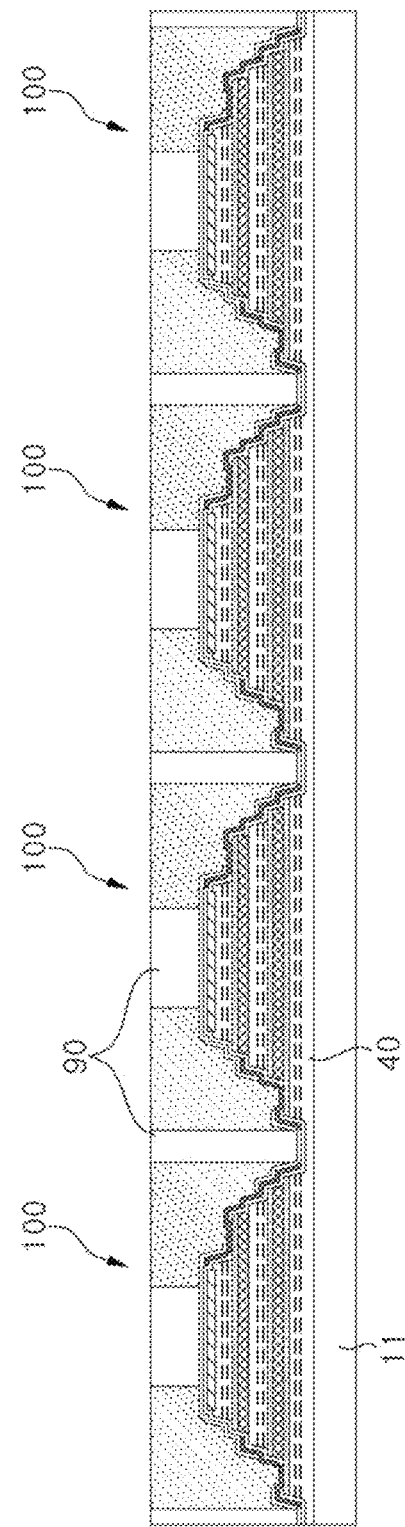
FIGS. 9, 10, 11, 12, and 13 are cross-sectional views schematically showing a process of manufacturing the light emitting device of FIG. 1A according to an exemplary embodiment.
Figure 10:
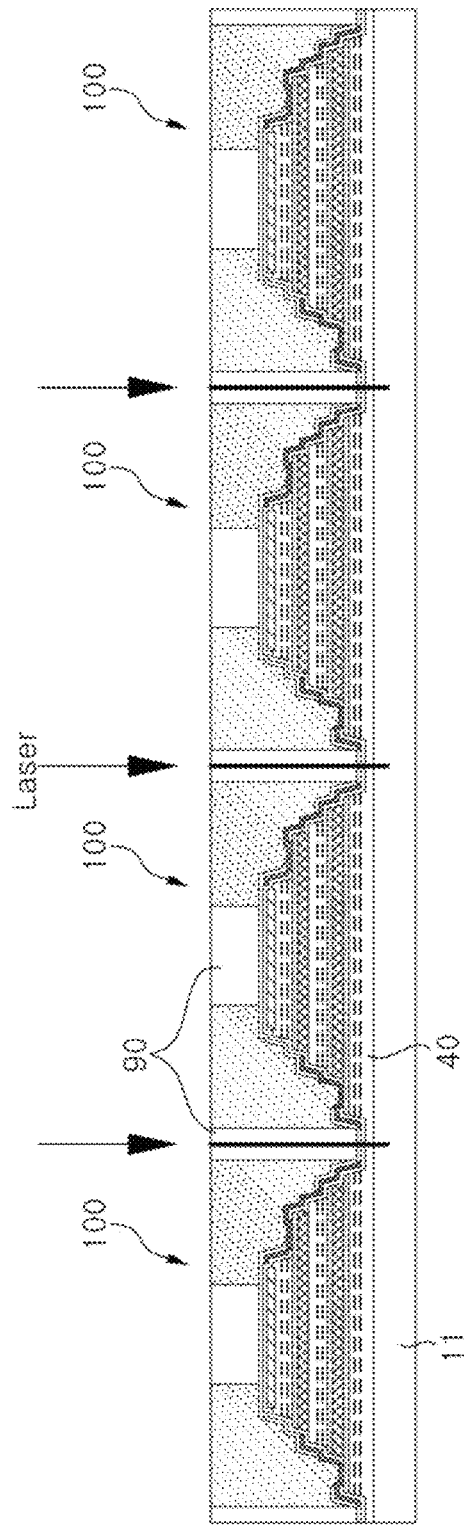
Figure 11:
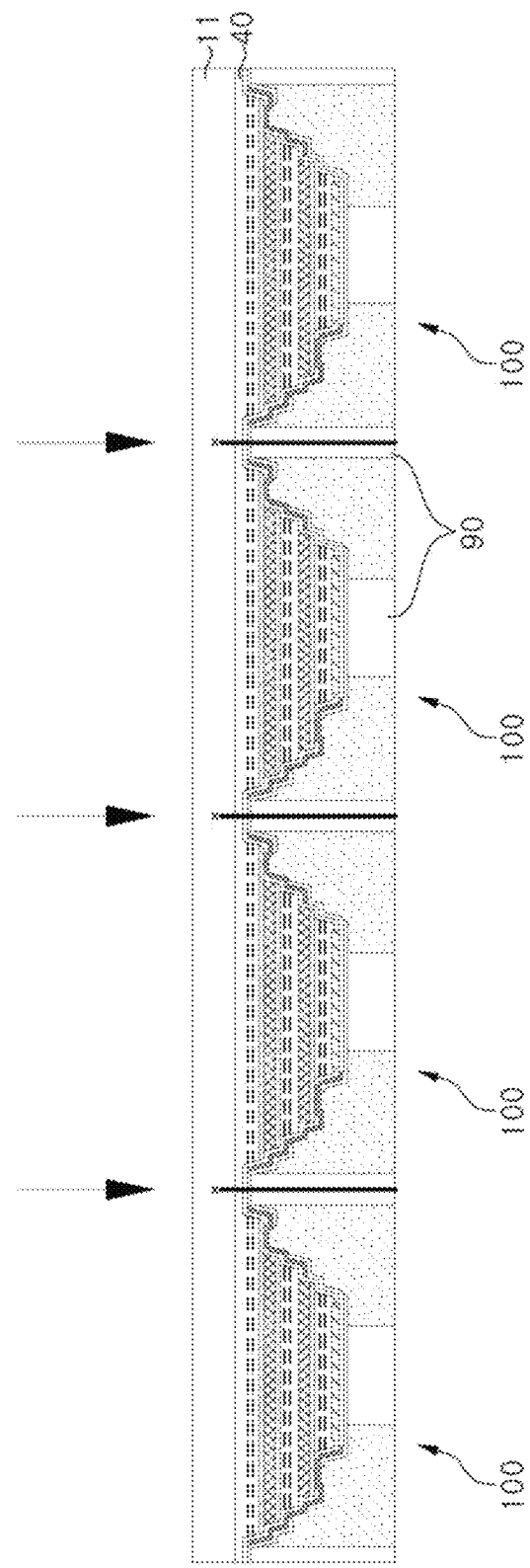

FIG. 9 exemplarily shows a plurality of light emitting devices 100 disposed on the substrate 11, and a singularizing process is applied to separate the light emitting devices 100. Referring to FIG. 10, according to an exemplary embodiment, laser beams may be irradiated between the light emitting stack structures to form a separation path that partially separates the light emitting stack structures. Referring to FIG. 11, a separation path may be added in the substrate 11 using a stealth laser. The stealth laser may be irradiated in a direction opposite to a surface to which the laser of FIG. 10 is irradiated.

Figure 12:
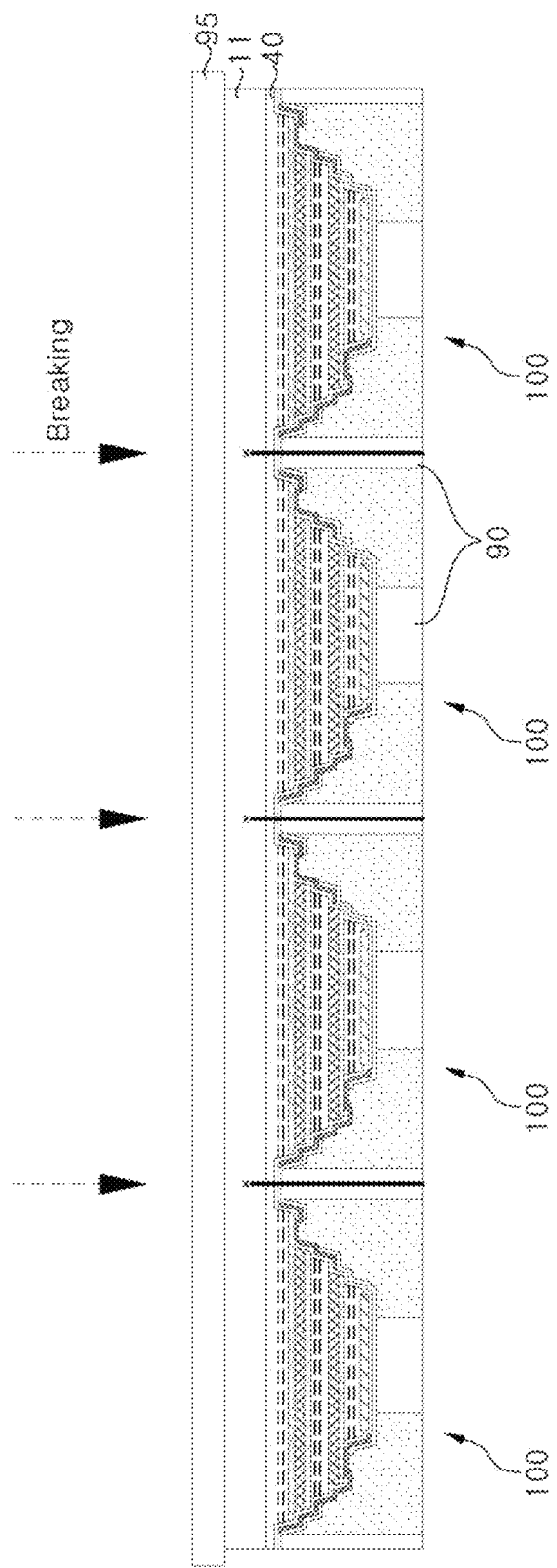

Referring to FIG. 12, the substrate 11 with a first bonding layer 95 attached thereon may be cut or broken using various methods that are well known in the art. For example, the substrate 11 may be cut by dicing the substrate 11 through a scribing line formed thereon, or may be broken by applying a mechanical force along the separation path formed during a laser radiation process. The first bonding layer 95 may be a tape, but the inventive concepts are not limited thereto, as long as the first bonding layer 95 may stably attach the light emitting devices 100 while being capable of separating the light emitting devices 100 in a subsequent process. Although the first bonding layer 95 has been described above as being attached on the substrate 11 after the laser radiation step, the first bonding layer 95 may be attached on the substrate 11 before the laser radiation step in other exemplary embodiments.

Figure 13:
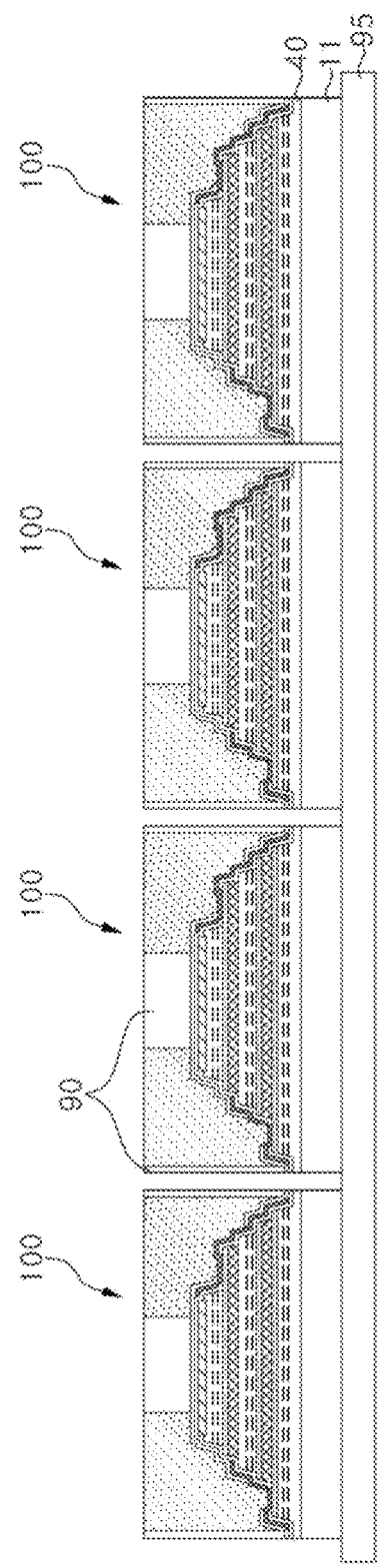

Referring to FIG. 13, after the substrate 11 is separated into individual light emitting devices 100, the first bonding layer 95 may be expanded, and accordingly, the light emitting devices 100 may be spatially spaced apart from one another.

Figure 14:
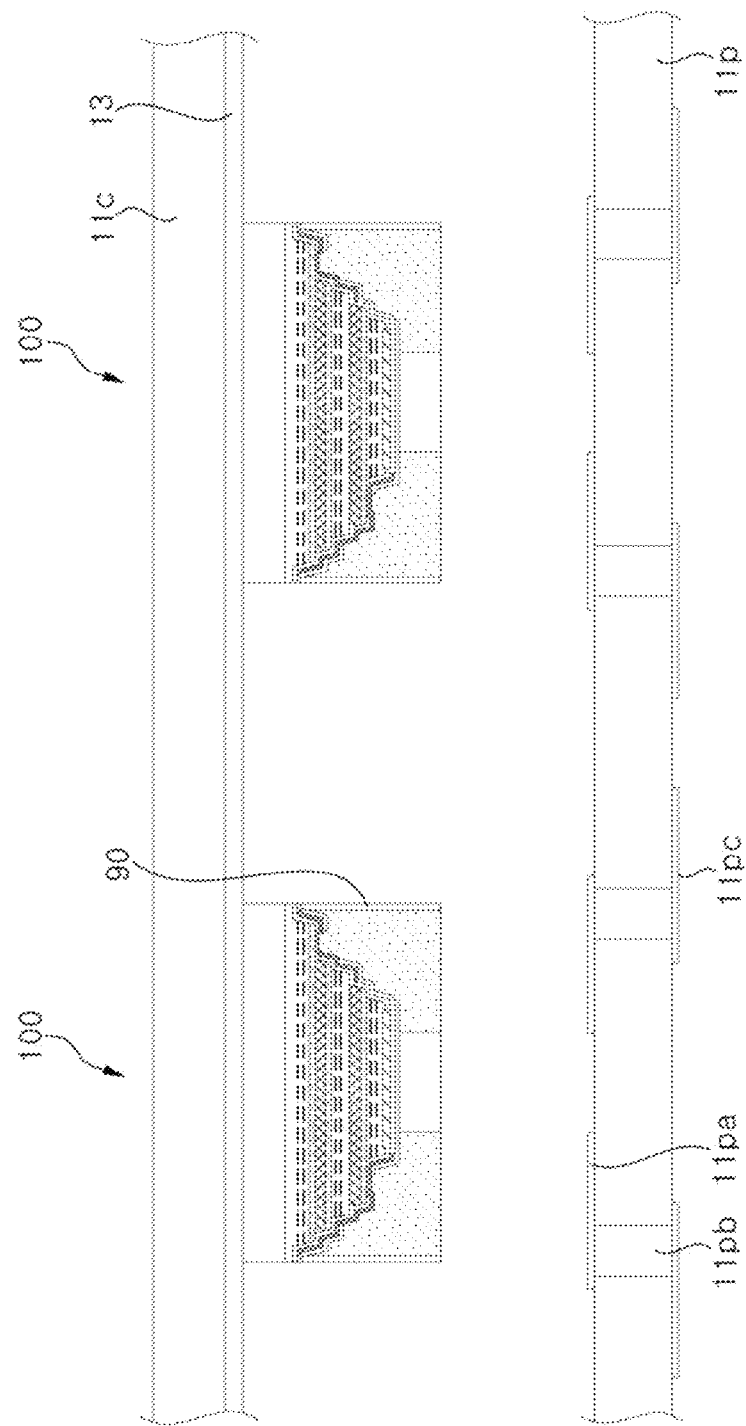
FIGS. 14, 15A, 15B, and 16A are cross-sectional views schematically illustrating a process of manufacturing a light emitting package according to an exemplary embodiment.
Figure 15A:
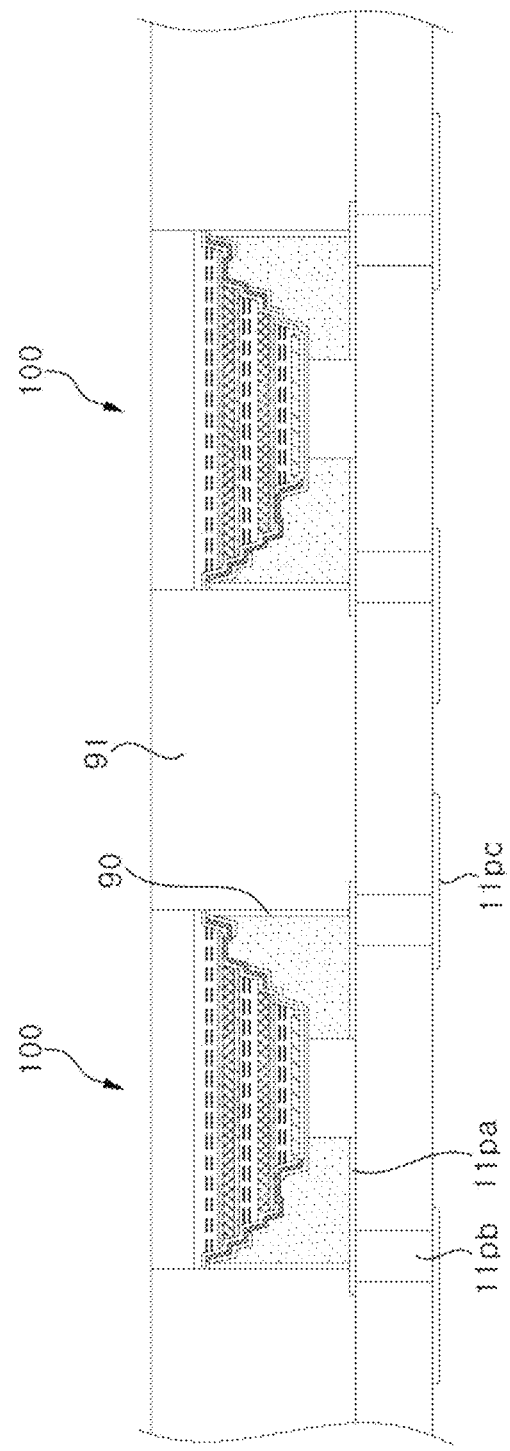
Figure 15B:
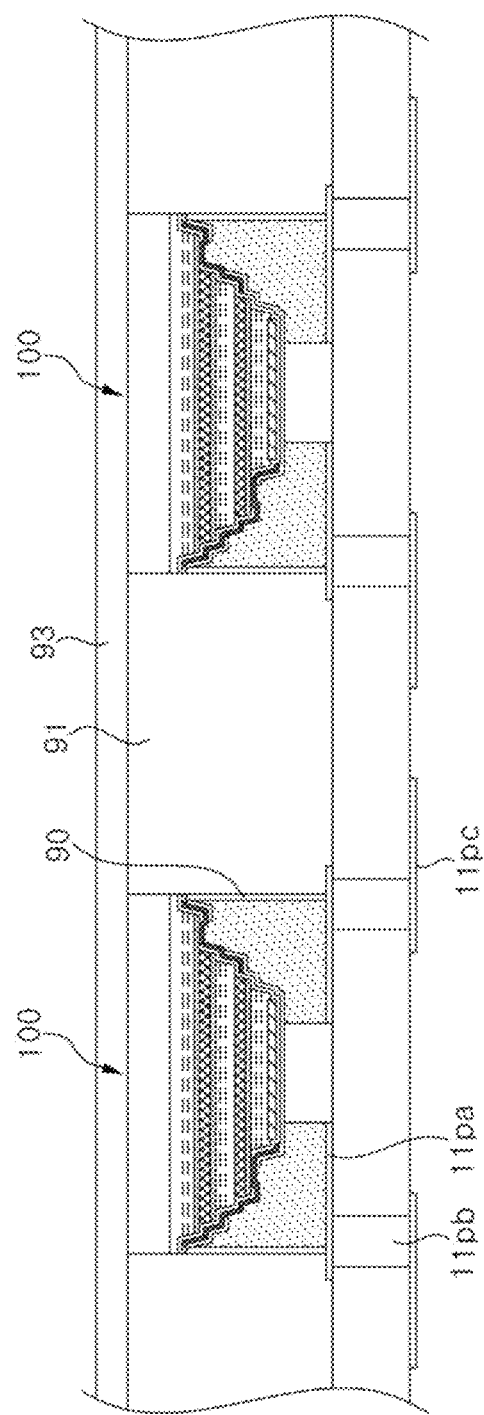
Figure 16A:
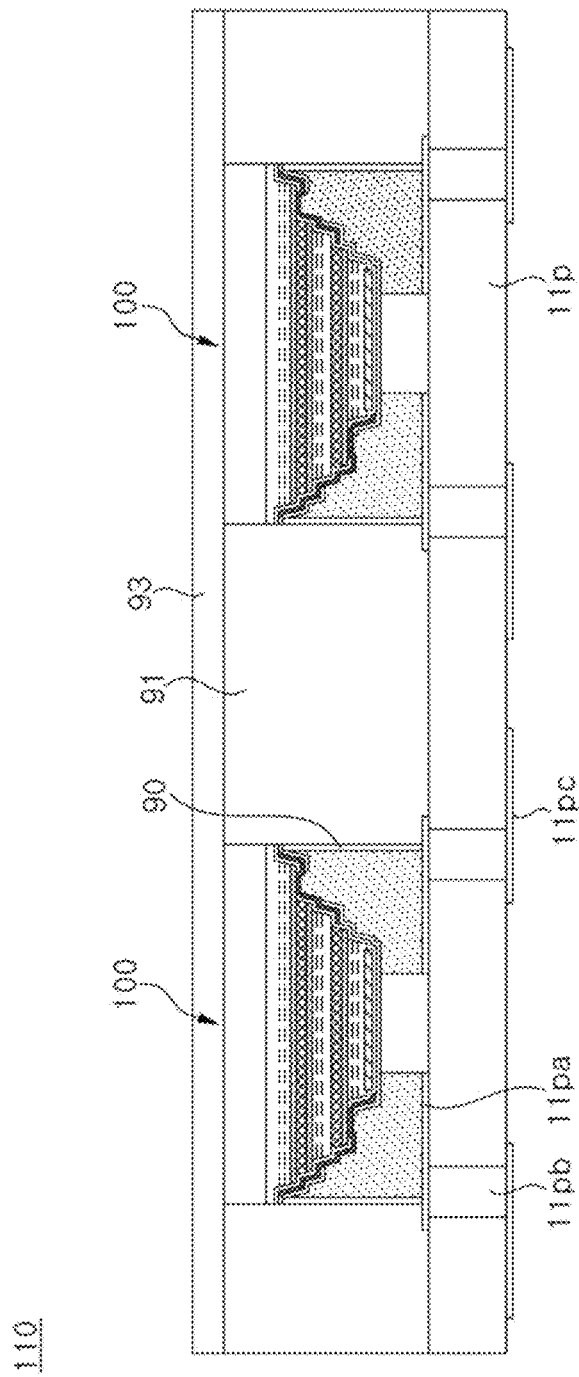
Figure 16B:
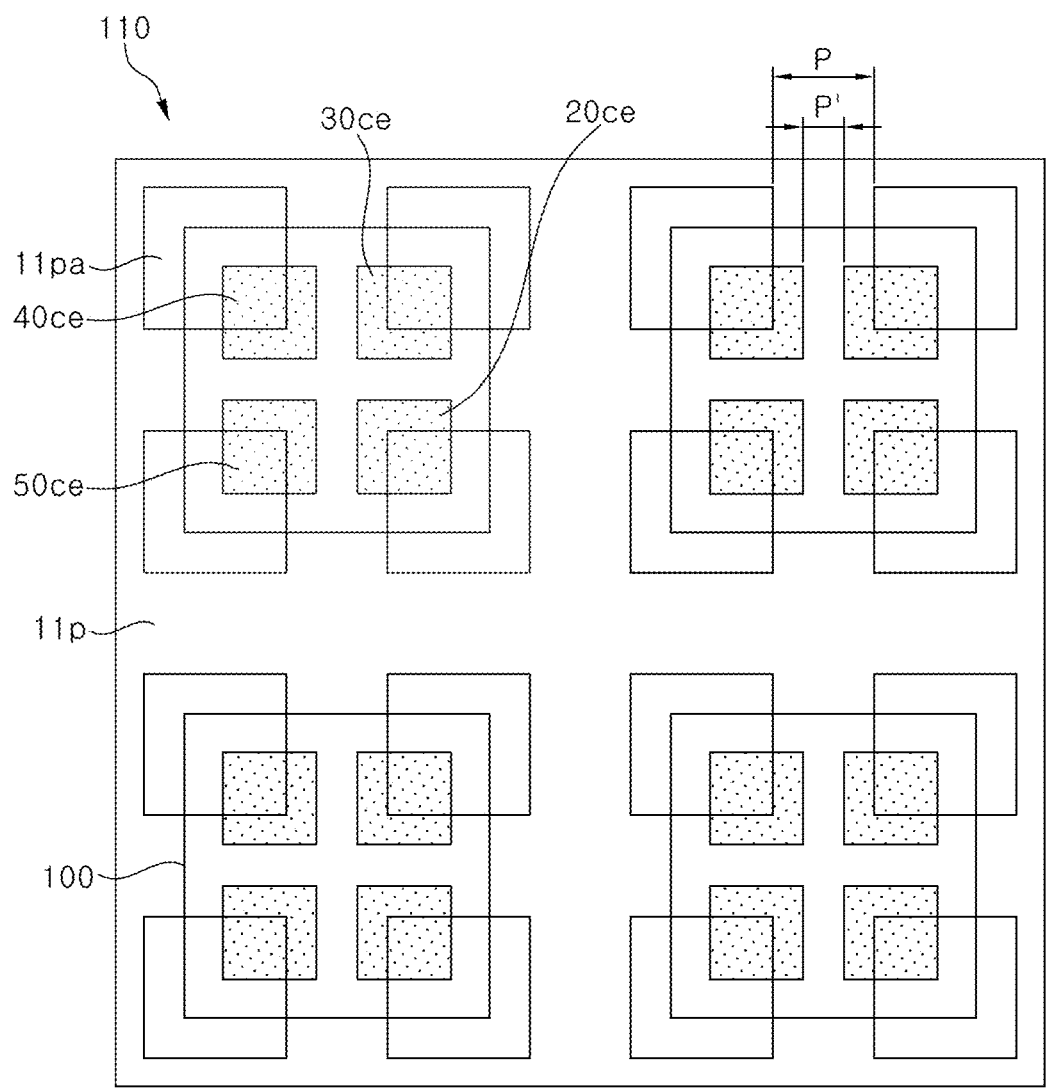
FIG. 16B is a plan view illustrating a light emitting package according to an exemplary embodiment.

FIGS. 14, 15A, 15B, and 16A are cross-sectional views schematically illustrating a process of manufacturing a light emitting package according to an exemplary embodiment, and FIG. 16B is a plan view of a light emitting package according to an exemplary embodiment. The light emitting device 100 according to an exemplary embodiment may be transferred and packaged in various ways well known in the art. Hereinafter, although a second adhesive layer 13 is illustrated as being attached to the substrate 11 using a carrier substrate 11c to transfer the light emitting device 100, the inventive concepts are limited to a specific transfer method.

Referring to FIG. 14, according to an exemplary embodiment, the singularized light emitting device 100 may be transferred to the carrier substrate 11c with the second adhesive layer 13 disposed therebetween. In this case, when the light emitting device 100 includes connection electrodes protruding outward from the light emitting stack structure without a protection layer 90, various problems may occur in subsequent processes, particularly in a transfer process, due to the non-uniformed structure as described above. In addition, when the light emitting device 100 includes micro-LEDs having a surface area of about 10,000 μm$^2$ or less, about 4,000 μm$^2$ or less, or about 2,500 μm$^2$ or less, depending on the application, handling of the light emitting device may be more difficult due to its small form factor. However, according to exemplary embodiments, since the light emitting device 100 includes the protection layer 90 disposed between the connection electrodes 20ce, 30ce, 40ce, and 50ce, handling of the light emitting device 100 may be facilitated during subsequent processes such as transfer and packaging. In addition, the light emitting structure may be protected by the protective layer 90 from external impact, and interference of light between adjacent light emitting devices 100 may be prevented.

The carrier substrate 11c is not particularly limited as long as the carrier substrate 11c stably mounts the light emitting device 100 with the second adhesive layer 13. The second adhesive layer 13 may be a tape, but the inventive concepts are not limited thereto, as long as the second adhesive layer 13 stably attaches the light emitting device 100 to the carrier substrate 11c, and the light emitting device 100 is capable of being separated during subsequent processes. In some exemplary embodiments, the light emitting device 100 of FIG. 13 may not be transferred to the separate carrier substrate 11c, but may be directly transferred to a circuit board 11p.

The light emitting device 100 may be mounted on the circuit board 11p. According to an exemplary embodiment, the circuit board 11p may include an upper circuit electrode 11pa, a lower circuit electrode 11pc, and an intermediate circuit electrode 11pb that are electrically connected to one another. The upper circuit electrodes 11pa may correspond to each of the first, second, third, and fourth connection electrodes 20ce, 30ce, 40ce, and 50ce, respectively. In some exemplary embodiments, since the upper circuit electrodes 11pa are surface-treated by ENIG, and partially melt at a high temperature, electrical connection to the connection electrodes of the light emitting device 100 may be facilitated.

According to the illustrated exemplary embodiment, the light emitting devices 100 may be spaced apart from one another on the carrier substrate 11c at a desired pitch in consideration of a pitch (P, see FIG. 16B) of the upper circuit electrode 11pa of the circuit board 11p, which will be mounted on a final target device, such as a display apparatus.

According to an exemplary embodiment, the first, second, third, and fourth connection electrodes 20ce, 30ce, 40ce, and 50ce of the light emitting device 100 may be bonded to the upper circuit electrodes 11pa of the circuit board 11p, respectively, by anisotropic conductive film (ACF) bonding, for example. When the light emitting device 100 is bonded to the circuit board through ACF bonding which may be performed at a lower temperature than other bonding methods, the light emitting device 100 may be prevented from being exposed to a high temperature while bonding. However, the inventive concepts are not limited to a specific bonding method. For example, in some exemplary embodiments, the light emitting devices 100 may be bonded to the circuit board 11p using anisotropic conductive paste (ACP), solder, a ball grid array (BGA), or a micro bump including at least one of Cu and Sn. In this case, since the upper surfaces of the connection electrodes 20ce, 30ce, 40ce, and 50ce and the protection layer 90 are substantially flush with one another by a polishing process or the like, adhesion of the light emitting device 100 to the anisotropic conductive film increases, and thus a more stable structure may be formed while being bonded to the circuit board 11p.

Referring to FIG. 15A, a light blocking layer 91 is formed between the light emitting devices 100. According to an exemplary embodiment, the light blocking layer 91 may block light by reflecting or absorbing light emitted from the light emitting device 100. In an exemplary embodiment, the light blocking layer 91 may be a black molding layer that absorbs and blocks light. The light blocking layer 91 may be substantially flush with an upper surface of the light emitting device 100, that is, a light emission surface. The light blocking layer 91 may cover a side surface of the substrate 11 and may be flush with an upper surface of the substrate 11. As such, the light blocking layer 91 may prevent light from being emitted through the side surface of the substrate 11. Since the light emitting surface is limited to the upper surface of the substrate 11 by the light blocking layer 91, viewing angles of light of the first, second, and third light emitting stacks 20, 30, and 40 may become substantially the same. In addition, the light blocking layer 91, together with the protection layer 90 formed on the light emitting device 100, provides additional protection to the light emitting package by reinforcing the structure thereof.

In an exemplary embodiment, the light blocking layer 91 may include an organic or inorganic polymer. In some exemplary embodiments, the light blocking layer 91 may further include fillers such as silica or alumina. In some exemplary embodiments, the light blocking layer 91 may include the same material as the protection layer 90. The light blocking layer 91 may be formed through various methods well known in the art, such as lamination, plating and/or printing methods. For example, the light blocking layer 91 may be formed by a vacuum lamination process, in which an organic polymer sheet is disposed on the light emitting device 100 and subjected to a high temperature and a high pressure in vacuum, and thus, a substantially flat upper surface of the light emitting package may be provided, thereby improving uniformity of light. The light blocking layer 91 may be partially removed to expose the upper surface of the light emitting device 100, that is, the upper surface of the substrate 11, through a grinding process or an entire surface etching process.

In some exemplary embodiments, the substrate 11 may be removed from the light emitting device 100 before the light blocking layer 91 is formed. In this case, the light blocking layer 91 may cover a side surface of the first conductivity type semiconductor layer 41 and expose an upper surface of the first conductivity type semiconductor layer 41.

Referring to FIG. 15B, a transparent layer 93 covering the light blocking layer 91 and the light emitting devices 100 is formed. The transparent layer 93 transmits light emitted from the first, second, and third light emitting stacks 20, 30, and 40. The transparent layer 93 may increase a viewing angle of light emitted from the light emitting device 100 by a light guiding effect. For example, the viewing angle of light emitted from the light emitting device 100 may be in a range of about 110 degrees to about 120 degrees. A thickness of the transparent layer 93 may be adjusted to achieve the above viewing angle.

In an exemplary embodiment, the transparent layer 93 may be formed of an insulation layer having a refractive index between that of the substrate 11 and that of air. As such, it is possible to reduce loss of light caused by total internal reflection at an interface between the substrate 11 and air. In particular, a difference between a refractive index of the transparent layer 93 and that of air may have a value smaller than a difference between a refractive index of the first conductivity type semiconductor layer 41 and that of the substrate 11. The transparent layer 93 may be formed of, for example, $SiO_2$, silicone resin, epoxy, polyimide, SUB, spin-on-glass (SOG), benzocyclobutene (BCB), or the like. The transparent layer 93 may be formed as a single layer, but the inventive concepts are not limited thereto, and may be formed as a plurality of layers.

Referring to FIGS. 16A and 16B, the light emitting device 100 disposed on the circuit board 11p may be cut into a desired configuration and formed as a light emitting package 110. FIG. 16B exemplarily illustrates the light emitting package 110 including four light emitting devices 100 (2×2) disposed on the circuit board 11p. However, the inventive concepts are not limited to a specific number of light emitting devices formed in the light emitting package 110. For example, in some exemplary embodiments, the light emitting package 110 may include one or more light emitting devices 100 formed on the circuit board 11p. In addition, the inventive concepts are not limited to a specific arrangement of one or more light emitting devices 100 in the light emitting package 110, and for example, one or more light emitting devices 100 in the light emitting package 110 may be arranged in an n×m-arrangement, where n and m refer to natural numbers. According to an exemplary embodiment, the circuit board 11p may include a scan line and a data line to independently drive each of the light emitting devices 100 included in the light emitting package 110.

Figure 17:
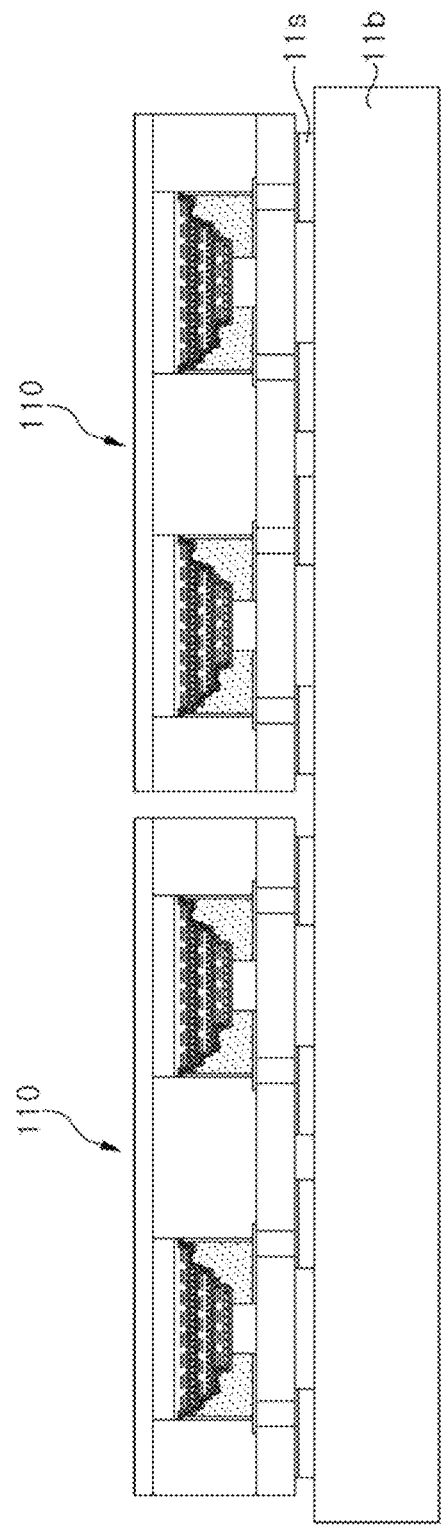
FIG. 17 is a schematic cross-sectional view illustrating a display apparatus according to an exemplary embodiment.

FIG. 17 is a schematic cross-sectional view illustrating a display apparatus according to an exemplary embodiment.

Referring to FIG. 17, the display apparatus may include a display substrate 11b and a light emitting package 110. The light emitting package 110 may be mounted on the display substrate 11b of a final apparatus, such as a display apparatus. The display substrate 11b may include target electrodes 11s that correspond to lower circuit electrodes 11pc of the light emitting package 110, respectively. The display apparatus according to an exemplary embodiment may include a plurality of pixels, and each of the light emitting devices 100 may be disposed to correspond to each pixel. More specifically, each light emitting stack of the light emitting devices 100 according to an exemplary embodiment may correspond to each sub-pixel of one pixel. Since the light emitting devices 100 include the light emitting stacks 20, 30, and 40 that are vertically stacked, the number of devices to be transferred for each sub-pixel may be substantially reduced than that of conventional light emitting devices to be transferred. In addition, since surfaces of connection electrodes opposite to each other have different lengths from each other, the connection electrodes may be stably formed in the light emitting stack structure to strengthen an internal structure thereof. In addition, since the light emitting devices 100 according to some exemplary embodiments include a protection layer 90 between the connection electrodes, the light emitting devices 100 may be protected from an external impact.

In the illustrated exemplary embodiment, although the light emitting package 110 is described as being mounted on the display substrate 11b, in some exemplary embodiments, the process of manufacturing the light emitting package 110 may be omitted, and the light emitting devices 100 may be directly mounted on the display substrate 11b, and a light blocking layer 91 and a transparent layer 93 may be formed thereon.

Figure 18:
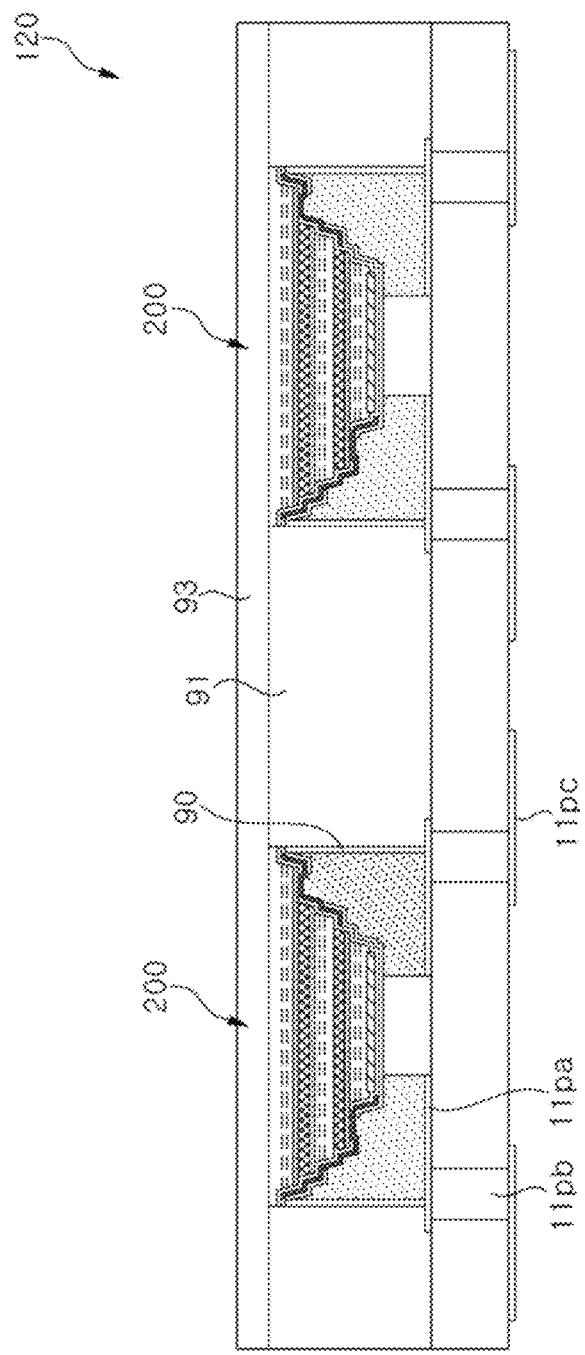
FIG. 18 is a schematic cross-sectional view illustrating a light emitting package according to another exemplary embodiment.

FIG. 18 is a schematic cross-sectional view illustrating a light emitting package 120 according to another exemplary embodiment.

Referring to FIG. 18, the light emitting package 120 according to the illustrated exemplary embodiment is substantially similar to the light emitting package 110 described with reference to FIGS. 15A, 15B, 16A, and 16B, but a light emitting device 200 according to the illustrated exemplary embodiment does not include the substrate 11. The substrate 11 is removed from the light emitting device 100, and thus, the first conductivity type semiconductor layer 41 is exposed. The light emitting device 200 emits light through the upper surface of the first conductivity type semiconductor layer 41, and thus, the upper surface of the first conductivity type semiconductor layer 41 becomes a light emission surface. The light blocking layer 91 covers a side surface of the first conductivity type semiconductor layer 41 and exposes the upper surface thereof, and the transparent layer 93 covers the light blocking layer 91 and the first conductivity type semiconductor layers 41.

Figure 19:
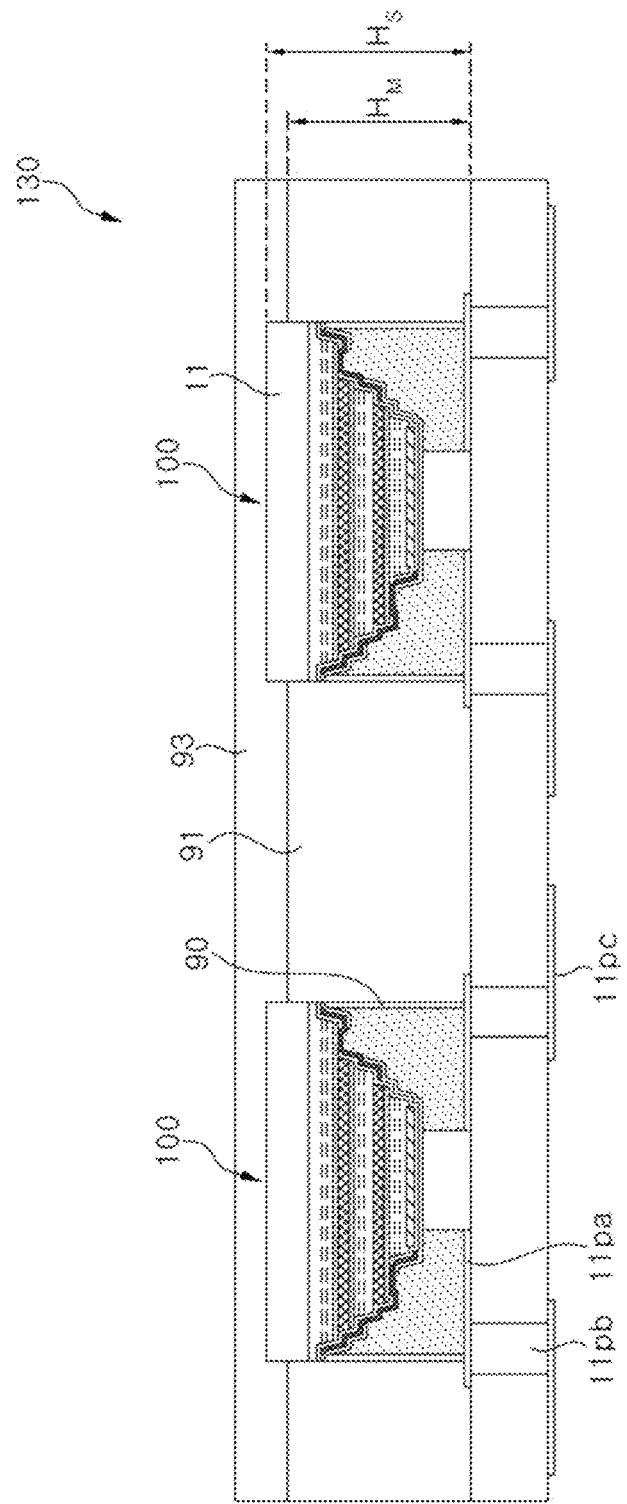
FIG. 19 is a schematic cross-sectional view illustrating a light emitting package according to another exemplary embodiment.

FIG. 19 is a schematic cross-sectional view illustrating a light emitting package 130 according to another exemplary embodiment.

Referring to FIG. 19, the light emitting package 130 according to the illustrated exemplary embodiment is substantially similar to the light emitting package 110 described with reference to FIGS. 15A, 15B, 16A, and 16B, but a height $H_M$ of an upper surface of the light blocking layer 91 is less than a height Hs of the light emitting surface of the substrate 11. As such, at least a portion of the side surface of the substrate 11 is exposed without being covered by the light blocking layer 91, and the transparent layer 93 covers the upper surface of the substrate 11 and the exposed side surface thereof.

Since light may be emitted to the outside through the exposed portion of the side surface of the substrate 11, the viewing angle of light emitted from the light emitting device 100 may be further increased.

In some exemplary embodiments, the upper surface of the light blocking layer 91 may be disposed to expose at least a portion of the third light emitting stack 40, and in this case, loss of light emitted from the third light emitting stack 40 by the light blocking layer 91 may be reduced, thereby increasing luminous intensity of light emitted from the third light emitting stack 40. For example, when the third light emitting stack 40 emits green light, it is possible to increase luminous intensity of green light, and thus an RGB mixing ratio may be easily adjusted to a desired value.

Figure 20:
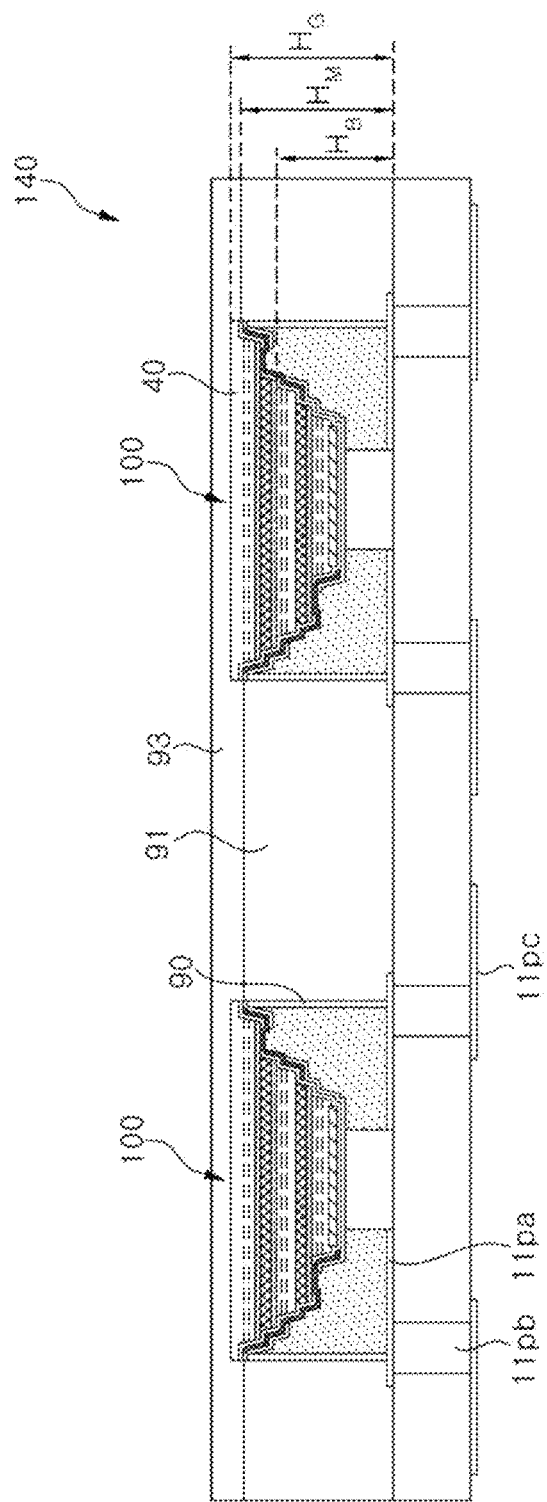
FIG. 20 is a schematic cross-sectional view illustrating a light emitting package according to another exemplary embodiment.

FIG. 20 is a schematic cross-sectional view illustrating a light emitting package 140 according to another exemplary embodiment.

Referring to FIG. 20, the light emitting package 140 according to the illustrated exemplary embodiment is substantially similar to the light emitting package 120 described with reference to FIG. 18, but a height $H_M$ of an upper surface of the light blocking layer 91 is less than a height $H_G$ of a light emitting surface of the third light emitting stack 40. As such, at least a portion of a side surface of the third light emitting stack 40 is exposed without being covered by the light blocking layer 91, and the transparent layer 93 covers an upper surface of the third light emitting stack 40 and the exposed side surface thereof.

Since light may be emitted to the outside through the exposed portion of the side surface of the third light emitting stack 40, a viewing angle of light emitted from the light emitting device 100 may be further increased.

Furthermore, loss of light emitted from the third light emitting stack 40 by the light blocking layer 91 may be reduced, and thus, luminous intensity of light emitted from the third light emitting stack 40 may be increased. For example, when the third light emitting stack 40 emits green light, it is possible to increase luminous intensity of green light, and thus, an RGB mixing ratio may be easily adjusted to a desired value. Meanwhile, to prevent an increase in the luminous intensity of blue light, the height $H_M$ of the light blocking layer 91 is greater than a height $H_B$ of the second light emitting stack 30.

In the above exemplary embodiments, the transparent layer 93 may cover entire surfaces of the light emitting devices 100 or 200. However, the inventive concepts are not limited thereto, and the transparent layer 93 may partially cover the light emitting devices 100 or 200. This will be described with reference to FIG. 21.

Figure 21:
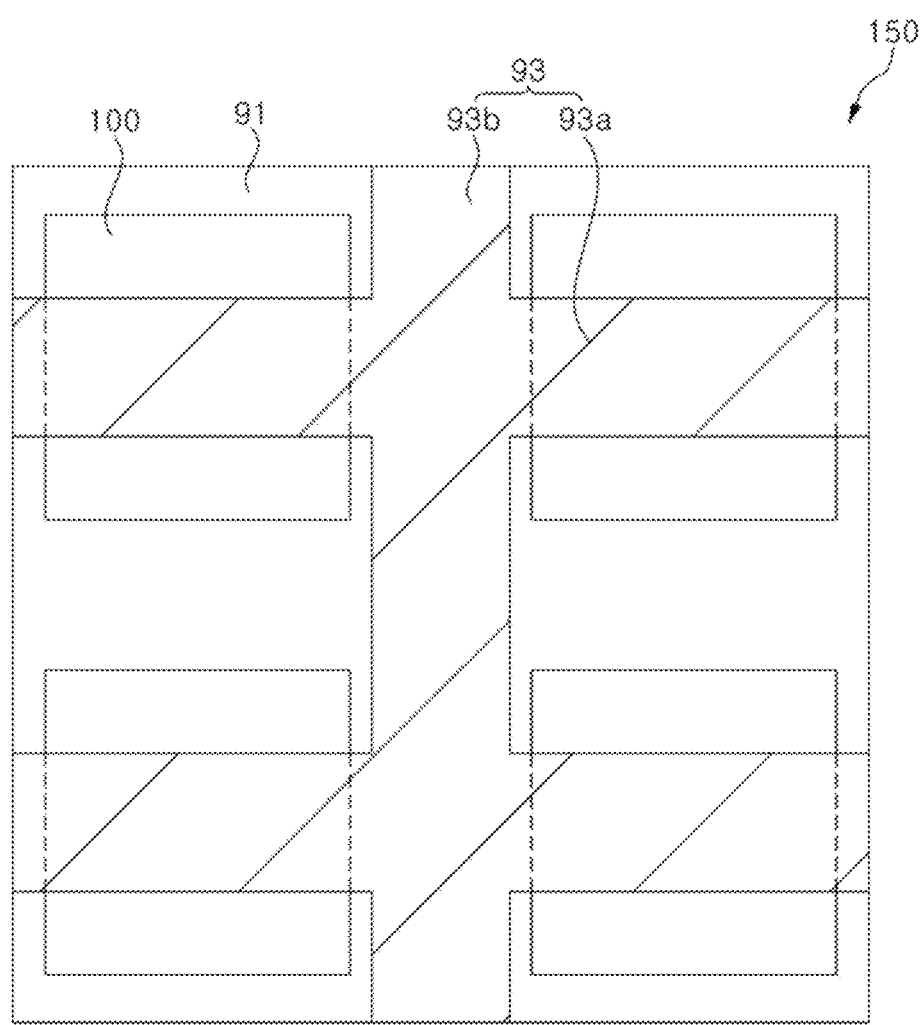
FIG. 21 is a schematic plan view illustrating a light emitting package according to another exemplary embodiment.

FIG. 21 is a schematic plan view illustrating a light emitting package 150 according to another exemplary embodiment.

Referring to FIG. 21, the light emitting package 150 according to the illustrated exemplary embodiment has a shape in which a transparent layer 93 is patterned. A light blocking layer 91 is disposed between the light emitting devices 100, and the transparent layer 93 is disposed on the light emitting devices 100 and on the light blocking layer 91. The transparent layer 93 is patterned to partially cover the light emitting devices 100. In particular, as illustrated, the transparent layer 93 may have a mesh shape including a transparent layer 93a extending in the lateral direction and a transparent layer 93b extending in the longitudinal direction. The transparent layer 93a in the lateral direction crosses the light emitting devices 100, and the transparent layer 93b in the longitudinal direction is disposed on the light blocking layer 91.

A viewing angle of light emitted from the light emitting device 100 in the lateral direction may be increased to a greater extent than that of light emitted from the light emitting device 100 in the longitudinal direction by the transparent layer 93a extending in the lateral direction. In general, since the human eye is more sensitive to a light variation in the lateral direction of a display image than that in the longitudinal direction thereof, it is possible to selectively reduce the light variation in the lateral direction perceived by the human eye by increasing the viewing angle in the lateral direction.

Meanwhile, the transparent layer 93 may be patterned after being formed on the light blocking layer 91, but the transparent layer 93 may be attached to the light emitting devices 100 and the light blocking layer 91 by fabricating a mesh-shaped sheet.

In the illustrated exemplary embodiment, the transparent layer 93 is described as having a mesh shape, but the inventive concepts are not limited thereto. For example, in some exemplary embodiments, the transparent layer 93 may be disposed to cross an upper surface of the light emitting device 100 in the lateral direction, and thus, the light variation in the lateral direction may be reduced.

In the illustrated exemplary embodiment, the light emitting package 150 is described as including the light emitting devices 100, but in some exemplary embodiments, the light emitting package may include light emitting devices 200 instead of the light emitting devices 100.

Although various exemplary embodiments of the light emitting packages 110, 120, 130, 140, and 150 have been described above, in some exemplary embodiments, the light emitting devices 100 or 200 may be directly mounted on the display substrate without a process of forming the light emitting package, and the light blocking layer 91 and the transparent layer 93 may be formed on the display substrate.

According to exemplary embodiments, since the first, second, and third LED sub-units overlap with one another, an area of each sub-pixel within a restricted pixel area may be increased without increasing the pixel area. Furthermore, since the light emitting device includes the first, second, and third LED sub-units, the number of light emitting devices may be reduced compared to conventional light emitting devices, and accordingly, a time associated with a mounting process of light emitting devices may be reduced.

In addition, since the light blocking layer is disposed between the light emitting devices, light interference between the light emitting devices may be prevented, and since the transparent layer covers the light emitting devices, viewing angles of light emitted from the light emitting device may be increased.

The transparent layer may be disposed to cross the light emitting devices in one direction, and thus, viewing angles of light emitted from the light emitting devices may be adjusted differently depending on directions thereof.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus, comprising:
    a display substrate;
    a plurality of light emitting devices disposed on the display substrate;
    a light blocking layer disposed between the light emitting devices; and
    a transparent layer covering the light emitting devices and the light blocking layer,
    wherein at least one of the light emitting devices includes:
        a first LED sub-unit;
        a second LED sub-unit disposed on the first LED sub-unit;
        a third LED sub-unit disposed on the second LED sub-unit; and
        a substrate disposed on the third LED sub-unit,
    wherein the third LED sub-unit is disposed closer to an upper surface of the light emitting device than the first LED sub-unit, and
    wherein a difference in refractive indices between the transparent layer and air is less than a difference in refractive indices between the substrate and a semiconductor layer of the third LED sub-unit.

2. The display apparatus of claim 1, wherein the light blocking layer is configured to block light by absorbing light emitted from the light emitting device, and the transparent layer is configured to transmit light emitted from the light emitting device.

3. The display apparatus of claim 2, wherein the light blocking layer comprises a black molding layer.

4. The display apparatus of claim 1, wherein the first, second, and third LED sub-units are configured to emit red light, blue light, and green light, respectively.

5. The display apparatus of claim 1, wherein:
    the first LED sub-unit includes a first light emitting stack;
    the second LED sub-unit includes a second light emitting stack;
    the third LED sub-unit includes a third light emitting stack; and
    each of the light emitting stacks includes a first conductivity type semiconductor layer, an active layer, and a second conductivity type semiconductor layer.

6. The display apparatus of claim 5, wherein the transparent layer partially covers the light emitting devices.

7. The display apparatus of claim 6, wherein the transparent layer is disposed to cross the light emitting devices in one direction.

8. The display apparatus of claim 7, wherein:
    the transparent layer has a mesh shape and includes a first transparent layer extending in a lateral direction and a second transparent layer extending in a longitudinal direction;
    the first transparent layer crosses the light emitting devices; and
    the second transparent layer is disposed on the light blocking layer in a region between the light emitting devices.

9. The display apparatus of claim 5, wherein an upper surface of the light blocking layer is placed at the same elevation or lower than that of the light emitting device.

10. The display apparatus of claim 5, wherein
    the substrate and the semiconductor layer of the third LED sub-unit comprises the first conductivity type semiconductor of the third light emitting stack.

11. The display apparatus of claim 8, wherein
    the upper surface of the light blocking layer is placed at a lower elevation than that of an upper surface of the substrate to expose at least a portion of a side surface of the substrate.

12. The display apparatus of claim 9, wherein the light blocking layer is placed a lower elevation than that of an upper surface of the third light emitting stack to expose at least a portion of a side surface of the third light emitting stack.

13. The display apparatus of claim 5, wherein the light emitting device further includes:
    a first bonding layer interposed between the first LED sub-unit and the second LED sub-unit; and a second bonding layer interposed between the second LED sub-unit and the third LED sub-unit.

14. The display apparatus of claim 13, wherein the light emitting device further includes:
a first connection electrode electrically connected to the first LED sub-unit;
a second connection electrode electrically connected to the second LED sub-unit;
a third connection electrode electrically connected to the third LED sub-unit; and
a fourth connection electrode commonly electrically connected to the first, second, and third LED sub-units.

15. The display apparatus of claim 14, further comprising a circuit board interposed between the display substrate and the light emitting device,
wherein:
the first, second, third, and fourth connection electrodes are bonded to the circuit board; and
the light blocking layer is disposed on the circuit board.

16. The display apparatus of claim 14, wherein:
the first connection electrode, the second connection electrode, and the third connection electrode are electrically connected to the second conductivity type semiconductor layers of the first light emitting stack, the second light emitting stack, and the third light emitting stack, respectively; and
the fourth connection electrode is commonly electrically connected to the first conductivity type semiconductor layers of the first, second, and third light emitting stacks.

17. The display apparatus of claim 15, wherein:
the light emitting device further includes:
first, second, and third lower contact electrodes contacting the second conductivity type semiconductor layers of the first, second, and third light emitting stacks, respectively; and
a first insulation layer having first, second, and third contact holes partially exposing the first, second, and third lower contact electrodes;

the first insulation layer has sub-contact holes disposed on the first conductivity type semiconductor layers of the first, second, and third light emitting stacks; and
the sub-contact holes are spaced apart from one another.

18. The display apparatus of claim 17, wherein:
the light emitting device further includes first, second, and third pads overlapping with the first, second, and third contact holes and a fourth pad overlapping with the sub-contact holes; and
the first, second, third, and fourth connection electrodes are electrically connected to the first, second, third, and fourth pads, respectively.

19. A display apparatus, comprising:
a display substrate;
a plurality of light emitting devices disposed on the display substrate;
a black molding layer disposed between the light emitting devices to block light emitted from the light emitting devices; and
a transparent layer at least partially covering the light emitting devices and configured to transmit light emitted from the light emitting devices,
wherein at least one of the light emitting devices includes:
a first LED sub-unit;
a second LED sub-unit disposed on the first LED sub-unit;
a third LED sub-unit disposed on the second LED sub-unit; and
a substrate disposed on the third LED sub-unit,
wherein the third LED sub-unit is disposed closer to an upper surface of the light emitting device than the first LED sub-unit, and
wherein a difference in refractive indices between the transparent layer and air is less than a difference in refractive indices between the substrate and a semiconductor layer of the third LED sub-unit.

20. The display apparatus of claim 19, wherein an upper surface of the black molding layer is placed at the same elevation or lower than those of the light emitting devices.

* * * * *